United States Patent
Kayaba et al.

(10) Patent No.: US 11,209,735 B2
(45) Date of Patent: Dec. 28, 2021

(54) COMPOSITION FOR FORMING METAL-CONTAINING FILM, METHOD OF PRODUCING COMPOSITION FOR FORMING METAL-CONTAINING FILM, SEMICONDUCTOR DEVICE, AND METHOD OF PRODUCING SEMICONDUCTOR DEVICE

(71) Applicant: MITSUI CHEMICALS, INC., Tokyo (JP)

(72) Inventors: Yasuhisa Kayaba, Urayasu (JP); Shoko Ono, Kawasaki (JP); Hirofumi Tanaka, Tsukuba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 174 days.

(21) Appl. No.: 16/301,885

(22) PCT Filed: May 19, 2017

(86) PCT No.: PCT/JP2017/018939
§ 371 (c)(1),
(2) Date: Nov. 15, 2018

(87) PCT Pub. No.: WO2017/200107
PCT Pub. Date: Nov. 23, 2017

(65) Prior Publication Data
US 2019/0187560 A1 Jun. 20, 2019

(30) Foreign Application Priority Data
May 19, 2016 (JP) .............................. JP2016-100774

(51) Int. Cl.
| | |
|---|---|
| *G03F 7/075* | (2006.01) |
| *H01L 21/027* | (2006.01) |
| *H01L 21/3065* | (2006.01) |
| *H01L 21/02* | (2006.01) |
| *C09D 201/00* | (2006.01) |
| *G03F 7/16* | (2006.01) |
| *C09D 7/40* | (2018.01) |
| *G03F 7/11* | (2006.01) |
| *G03F 7/09* | (2006.01) |

(52) U.S. Cl.
CPC ......... *G03F 7/0755* (2013.01); *C09D 201/00* (2013.01); *G03F 7/0752* (2013.01); *G03F 7/0757* (2013.01); *G03F 7/16* (2013.01); *H01L 21/027* (2013.01); *H01L 21/02216* (2013.01); *H01L 21/02282* (2013.01); *H01L 21/3065* (2013.01); *C09D 7/40* (2018.01); *G03F 7/094* (2013.01); *G03F 7/11* (2013.01)

(58) Field of Classification Search
CPC .... G03F 7/0752; G03F 7/0755; G03F 7/0757; G03F 7/0042
See application file for complete search history.

(56) References Cited

U.S. PATENT DOCUMENTS

| | | | | |
|---|---|---|---|---|
| 5,980,619 | A | * 11/1999 | Braig | .................. C07F 9/3817 106/14.12 |
| 2015/0004801 | A1 | 1/2015 | Rahman et al. | |
| 2016/0177056 | A1* | 6/2016 | Mason | ..................... C08K 5/36 524/195 |

FOREIGN PATENT DOCUMENTS

| | | |
|---|---|---|
| CN | 105209973 A | 12/2015 |
| JP | 2008-248356 A | 10/2008 |
| JP | 2010-070786 A | 4/2010 |
| JP | 2013079374 A | 5/2013 |
| JP | 2014-134581 A | 7/2014 |
| JP | 2014-157242 A | 8/2014 |
| WO | 2014-207142 A1 | 12/2014 |
| WO | 2015/137193 A1 | 9/2015 |

OTHER PUBLICATIONS

Computer translation of JP2008-248356 (Description Patent Application 2007-093819), Matsuda et al. (Year: 2008).*
First Notice of Opinion of Examination dated May 15, 2020, by the State Intellectual Property Office of People's Republic of China in corresponding Chinese Patent Application No. 201780030268.1 and partial English translation of the Notice. (10 pages).
International Search Report (PCT/ISA/210) dated Aug. 15, 2017, by the Japan Patent Office as the International Searching Authority for International Application No. PCT/JP2017/018939.
Written Opinion (PCT/ISA/237) dated Aug. 15, 2017, by the Japan Patent Office as the International Searching Authority for International Application No. PCT/JP2017/018939.

* cited by examiner

*Primary Examiner* — Daborah Chacko-Davis
(74) *Attorney, Agent, or Firm* — Buchanan Ingersoll & Rooney PC

(57) ABSTRACT

A composition for forming a metal-containing film, the composition including: a compound (A) which is at least one selected from the group consisting of: a compound (a1) containing a cationic functional group containing at least one of a primary nitrogen atom or a secondary nitrogen atom, and a compound (a2) which is a compound other than the compound (a1) and which contains a nitrogen atom; and a compound (B) which is at least one selected from the group consisting of: a compound (b1) containing a carboxy group and at least one of a germanium atom, a tin atom, a selenium atom or a zirconium atom, and an ester of the compound (b1).

15 Claims, No Drawings

COMPOSITION FOR FORMING METAL-CONTAINING FILM, METHOD OF PRODUCING COMPOSITION FOR FORMING METAL-CONTAINING FILM, SEMICONDUCTOR DEVICE, AND METHOD OF PRODUCING SEMICONDUCTOR DEVICE

TECHNICAL FIELD

The present disclosure relates to a composition for forming a metal-containing film, a method of producing the composition for forming a metal-containing film, a semiconductor device, and a method of producing the semiconductor device.

BACKGROUND ART

A multilayer resist method is known as one of the methods of transferring a lithography pattern onto a substrate using a hard mask. The multilayer resist method is a method in which: a lower layer film, such as a silicon-containing lower layer resist film, which has an etching selectivity different from the etching selectivity of a photoresist film, namely, of an upper layer resist film, is interposed between the upper layer resist film and a substrate to be processed, to form a pattern in the upper layer resist film; the resulting upper layer resist pattern is used as an etching mask to transfer the pattern to the lower layer resist film; and further, the resulting lower layer resist pattern is used as an etching mask to transfer the pattern to the substrate to be processed.

As a composition for forming a lower layer resist film to be used in the multilayer resist method as described above, a composition for forming a silicon-containing film is well known, which is disclosed, for example, in Japanese Patent Application Laid-Open (JP-A) No. 2014-157242. Examples include: a silicon-containing inorganic film obtained by CVD; an $SiO_2$ film; an SiON film; an SOG (spin-on-glass) film, which is obtained by spin coating; a crosslinkable silsesquioxane film; and a film containing a silicon-containing compound, which is obtained by hydrolysis or condensation of a silicon compound.

So far, lithographic properties and stability of compositions for forming silicon-containing lower layer resist films have been investigated. For example, a technique has been disclosed in which a composition for forming a lower layer resist film, which composition contains a thermal crosslinking accelerator, is prepared to provide a lower layer resist film having favorable etching selectivity and storage stability. However, with an increasing trend in the miniaturization of semiconductor devices, not only line widths of patterns are getting finer, but also film thicknesses of upper layer resist films are getting smaller in order to prevent the collapse of the patterns. As a result, lower layer resist films are now required to have an improved performance, namely, an improved etching selectivity in patterns which are finer than the conventional ones.

Further, devices such as integrated circuit elements are becoming increasingly complicated, and there has been used a method in which a multilayer resist pattern formation is carried out on a patterned substrate having a wiring groove (trench), a plug groove (via), etc.; or a method in which a pattern formation is carried out for a plurality of times to produce a complicated pattern.

To meet the demand for producing complicated patterns, compositions containing metals have been proposed, as compositions for forming resist films.

For example, WO 2015/137193 discloses a composition for producing a semiconductor device, which composition contains a product obtained by allowing a metal compound to react with hydrogen peroxide.

JP-A No. 2014-134581 discloses a composition for forming a metal oxide-containing film, which composition contains: a metal oxide-containing compound obtained by the hydrolysis and the like of a metal compound (metal alkoxide); and an aromatic compound.

Further, in a state-of-the-art microfabrication which exceeds the limit of positioning accuracy during exposure, a technique has been proposed in which a positioning correction for processing is carried out in a self-aligned manner, by embedding into a recessed portion formed in a part (an SOG layer or an SOC (spin-on-carbon) layer) of a multilayer resist layer, a metal-containing composition having an etching property different from the etching property of the SOG layer or the SOC layer.

SUMMARY OF INVENTION

Technical Problem

In the multilayer resist method, when transferring an upper layer resist pattern onto a lower layer resist film, or when transferring a lower layer resist pattern onto a substrate to be processed, for example, dry etching such as plasma etching is widely used.

Most of coating films which have been practically used in the conventional multilayer resist method are organic films and silicon-containing films as described above. However, in a production process of a semiconductor device, in a marginal domain of lithography in recent years, a more complicated process has been proposed, and it has become difficult to construct a rational production process, using only conventional organic films and silicon-containing films. Therefore, a material having an etching selectivity for both film components of an organic film and a silicon-containing film is needed, in order to construct a more rational production process of a semiconductor device.

Further, resist films may be required to have a heat resistance (such as a resistance to a heat treatment, which may be carried out after forming the resist films).

Note that, the etching selectivity and the heat resistance required for resist films, as described above, are also required for films other than resist films (such as, for example, embedded dielectric films (shallow trench isolation films (STI films), pre-metal dielectric films (PMD films), inter-wiring layer dielectric films (IMD films, ILD films, etc.) and the like), from the viewpoint of realizing the formation of fine patterns.

The present disclosure has been made in view of the above described problems, and an object of the present disclosure is to provide: a composition for forming a metal-containing film, which composition allows for obtaining a metal-containing film having an excellent etching selectivity as well as an excellent heat resistance; and a method of producing the same.

Further, another object of the present disclosure is to provide: a semiconductor device using a composition for forming a metal-containing film, which composition allows for obtaining a metal-containing film having an excellent etching selectivity as well as an excellent heat resistance; and a method of producing the same.

Solution to Problem

Means for solving the above problems include the following embodiments.

<1> A composition for forming a metal-containing film, the composition comprising:
a compound (A) which is at least one selected from the group consisting of:
a compound (a1) containing a cationic functional group containing at least one of a primary nitrogen atom or a secondary nitrogen atom, and
a compound (a2) which is a compound other than the compound (a1) and which contains a nitrogen atom; and
a compound (B) which is at least one selected from the group consisting of:
a compound (b1) containing a carboxy group and at least one of a germanium atom, a tin atom, a selenium atom or a zirconium atom, and
an ester of the compound (b1).

<2> The composition for forming a metal-containing film according to <1>,
wherein the compound (a1) has a weight average molecular weight of from 130 to 400,000; and
wherein the compound (a2) has a weight average molecular weight of from 17 to 120.

<3> The composition for forming a metal-containing film according to <1> or <2>, wherein the compound (A) comprises the compound (a2).

<4> The composition for forming a metal-containing film according to any one of <1> to <3>,
wherein the compound (a1) is at least one selected from the group consisting of:
an aliphatic amine (A-1) having a weight average molecular weight of from 10,000 to 200,000,
a compound (A-2) containing a siloxane bond (Si—O bond) and an amino group, and having a weight average molecular weight of from 130 to 50,000, and
an amine (A-3) having a ring structure and having a weight average molecular weight of from 90 to 600; and
wherein the compound (a2) is a base (A-4).

<5> The composition for forming a metal-containing film according to any one of <1> to <4>, wherein the compound (B) has a weight average molecular weight of from 120 to 50,000.

<6> The composition for forming a metal-containing film according to any one of <1> to <5>, wherein the compound (b1) is a compound represented by the following Formula (1) or the following Formula (2), or a polymer comprising at least one of a structural unit represented by the following Formula (3) or a structural unit represented by the following Formula (4):

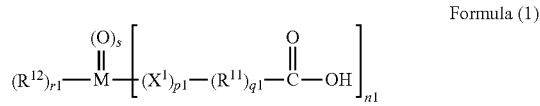

Formula (1)

wherein, in Formula (1),
$M^1$ represents a germanium atom, a tin atom, a selenium atom, or a zirconium atom;
$X^1$ represents —S—, —S—S—, —O—, —NH—, or —NR$^{13}$—, $R^{13}$ representing an alkyl group having from 1 to 10 carbon atoms;
$R^{11}$ represents an optionally substituted alkylene group having from 1 to 10 carbon atoms;

$R^{12}$ represents a hydrogen atom, an alkyl group having from 1 to 5 carbon atoms, a hydroxy group, an alkoxy group having from 1 to 5 carbon atoms, or a halogen atom;
p1 represents 0 or 1, and q1 represents 0 or 1; and
n1 represents an integer of 1 or more, r1 represents an integer of 0 or more, and s represents an integer of 0 or more, a sum of n1+r1+2s being a valence of $M^1$

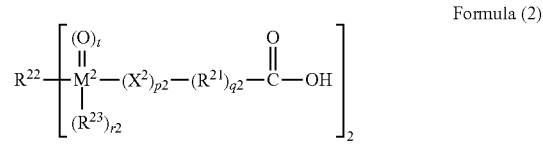

Formula (2)

wherein, in Formula (2),
$M^2$ represents a germanium atom, a tin atom, a selenium atom, or a zirconium atom;
$X^2$ represents —S—, —S—S—, —O—, —NH—, or —NR$^{24}$—, $R^{24}$ representing an alkyl group having from 1 to 10 carbon atoms;
$R^{21}$ represents an optionally substituted alkylene group having from 1 to 10 carbon atoms;
$R^{22}$ represents a single bond, —O—, or —NR$^{25}$—, $R^{25}$ representing an optionally substituted alkyl group having from 1 to 10 carbon atoms;
$R^{23}$ represents a hydrogen atom, an alkyl group having from 1 to 5 carbon atoms, a hydroxy group, an alkoxy group having from 1 to 5 carbon atoms, or a halogen atom;
p2 represents 0 or 1, and q2 represents 0 or 1; and
r2 represents an integer of 0 or more, and t represents an integer of 0 or more

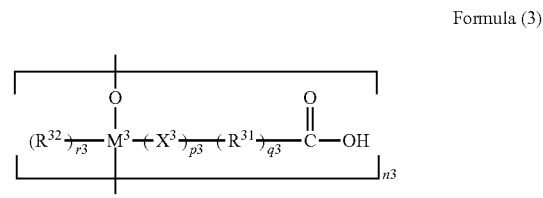

Formula (3)

wherein, in Formula (3),
$M^3$ represents a germanium atom, a tin atom, or a zirconium atom;
$X^3$ represents —S—, —S—S—, —O—, —NH—, or —NR$^{33}$—, $R^{33}$ representing an alkyl group having from 1 to 10 carbon atoms;
$R^{31}$ represents an optionally substituted alkylene group having from 1 to 10 carbon atoms;
$R^{32}$ represents a hydrogen atom, an alkyl group having from 1 to 5 carbon atoms, a hydroxy group, an alkoxy group having from 1 to 5 carbon atoms, or a halogen atom;
p3 represents 0 or 1, and q3 represents 0 or 1;
r3 represents 0 or 1, and in a case in which r3 is 0, $R^{32}$ represents a bond; and
n3 represents an integer of 2 or more Formula (4)

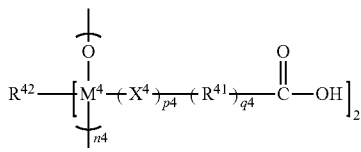

wherein, in Formula (4), $M^4$ represents a germanium atom, a tin atom, or a zirconium atom;

$X^4$ represents —S—, —S—S—, —O—, —NH—, or —$NR^{43}$—, $R^{43}$ representing an alkyl group having from 1 to 10 carbon atoms;

$R^{41}$ represents an optionally substituted alkylene group having from 1 to 10 carbon atoms;

$R^{42}$ represents a single bond, —O—, or $R^{44}$ representing an optionally substituted alkyl group having from 1 to 10 carbon atoms;

p4 represents 0 or 1, and q4 represents 0 or 1; and n4 represents an integer of 2 or more.

<7> The composition for forming a metal-containing film according to <6>, wherein, in Formula (1), in a case in which $M^1$ represents a germanium atom, a tin atom, or a zirconium atom, the sum of n1+r1+2s is 4, and in a case in which $M^1$ is a selenium atom, the sum of n1+r1+2s is 2; and wherein, in Formula (2), in a case in which $M^2$ represents a germanium atom, a tin atom, or a zirconium atom, a sum of r2+2t+2 is 4, and in a case in which $M^2$ represents a selenium atom, the sum of r2+2t+2 is 2.

<8> The composition for forming a metal-containing film according to any one of <1> to <7>, further comprising an additive (C) which is an acid containing a carboxy group and having a weight average molecular weight of from 46 to 195.

<9> The composition for forming a metal-containing film according to any one of <1> to <8>, further comprising a crosslinking agent (D) having a weight average molecular weight of from 200 to 600 and containing three or more —C(=O)OX groups within a molecule, each X representing a hydrogen atom or an alkyl group having from 1 to 6 carbon atoms, and from one to six of the three or more —C(=O)OX groups each being a —C(=O)OH group.

<10> The composition for forming a metal-containing film according to any one of <1> to <9>, wherein the composition is used for forming a metal-containing film in a multilayer resist layer comprising the metal-containing film.

<11> The composition for forming a metal-containing film according to any one of <1> to <9>, wherein the composition is used for forming a metal-containing film which is an embedded dielectric film in a semiconductor device comprising the metal-containing film.

<12> A method of producing the composition for forming a metal-containing film according to any one of <1> to <11>, the method comprising:

a mixing step of mixing at least the compound (A) and the compound (B).

<13> The method of producing the composition for forming a metal-containing film according to <12>, wherein the mixing step is a step of mixing at least a mixture of the compound (a2) and the compound (B), with the compound (a1).

<14> The method of producing the composition for forming a metal-containing film according to <12>, wherein the mixing step is a step of mixing at least: a mixture of an additive (C) which is an acid containing a carboxy group and having a weight average molecular weight of from 46 to 195, and the compound (a1), with the compound (B).

<15> The method of producing the composition for forming a metal-containing film according to <12>, wherein the mixing step is a step of mixing at least: a mixture of the compound (a2) and the compound (B), with a mixture of an additive (C) which is an acid containing a carboxy group and having a weight average molecular weight of from 46 to 195, and the compound (a1).

<16> A semiconductor device comprising a metal-containing film which is an embedded dielectric film, wherein the metal-containing film comprises the composition for forming a metal-containing film according to any one of <1> to <11>.

<17> A method of producing a semiconductor device comprising a metal-containing film which is an embedded dielectric film, the method comprising:

a step of forming the embedded dielectric film using the composition for forming a metal-containing film according to any one of <1> to <11>.

Advantageous Effects of Invention

According to the present disclosure, a composition for forming a metal-containing film, which composition allows for obtaining a metal-containing film having an excellent etching selectivity as well as an excellent heat resistance; and a method of producing the same are provided.

Further, according to the present disclosure, a semiconductor device using a composition for forming a metal-containing film, which composition allows for obtaining a metal-containing film having an excellent etching selectivity as well as an excellent heat resistance; and a method of producing the same are provided.

DESCRIPTION OF EMBODIMENTS

Embodiments of the present disclosure will now be described below.

In the present specification, any numerical range indicated using an expression "from * to" represents a range in which numerical values described before and after the "to" are included in the range as a lower limit value and an upper limit value.

[Composition for Forming Metal-Containing Film]

A composition for forming a metal-containing film according to the present disclosure (hereinafter, also referred to as the "composition") includes:

a compound (A) which is at least one selected from the group consisting of:

a compound (a1) containing a cationic functional group containing at least one of a primary nitrogen atom or a secondary nitrogen atom; and a compound (a2) which is a compound other than the compound (a1) and which contains a nitrogen atom; and a compound (B) which is at least one selected from the group consisting of:

a compound (b1) containing at least one of a germanium atom, a tin atom, a selenium atom or a zirconium atom, and a carboxy group; and an ester of the compound (b1).

The composition for forming a metal-containing film according to the present disclosure allows for obtaining a metal-containing film having an excellent etching selectivity as well as an excellent heat resistance.

The expression "having an excellent etching selectivity" as used herein means having etching properties different from the etching properties of other films (such as conventional organic films and conventional silicon-containing films) (for example, having a smaller or larger etching rate as compared to other films).

Further, the composition for forming a metal-containing film according to the present disclosure allows for obtaining a metal-containing film having excellent filling properties into a recessed portion as well.

The expression "having excellent filling properties into a recessed portion" means that the composition has favorable filling properties (namely, embeddability), for example, into a microtrench (such as a recessed portion having a width of 100 nm and a depth of 200 nm). Therefore, the composition according to the present disclosure facilitates obtaining a metal-containing film, in which the formation of voids is reduced, in a recessed portion.

It is thought that the effect of the present disclosure is obtained because of the following reasons.

In the present disclosure, the compound (b1) contains a carboxy group, and an ester of the compound (b1) contains a —C(=O)O— group. In other words, each of the compound (b1) and an ester of the compound (b1) contains a —C(=O)O— group.

Accordingly, when a metal-containing film is formed using the composition for forming a metal-containing film according to the present disclosure, the cationic functional group contained in the compound (a1) and containing at least one of a primary nitrogen atom or a secondary nitrogen atom, reacts with the —C(=O)O— group(s) contained in the compound (B), to form at least one of an amide bond, an imide bond, or an amide-imide bond in the metal-containing film. In other words, a crosslinked structure is formed between the compound (a1) and the compound (B), in the resulting metal-containing film.

In the present disclosure, the formation of at least one of an amide bond, an imide bond, or an amide-imide bond between the compound (B) and the compound (a1), namely the formation of a crosslinked structure, in the resulting metal-containing film, is thought to contribute to an improvement in the etching selectivity and the heat resistance.

Further, in the composition for forming a metal-containing film according to the present disclosure, a salt of the compound (a2) and the compound (B) can be formed in the composition. The formation of the above salt results in an improved solubility of the compound (a2) and the compound (B).

In the present disclosure, the above described improvement in solubility is thought to contribute to an improvement in the etching selectivity and the heat resistance.

In a case in which the composition contains both the compound (a1) and the compound (a2) as the compound (A), in particular, the formation of a salt of the compound (a2) and the compound (B) prevents gelation of the compound (a1) in the composition. This is thought to further improve the solubility of the compound (A) and the compound (B).

In the present disclosure, in a case in which a metal-containing film obtained from the composition for forming a metal-containing film is a resist pattern in a multilayer resist process, or an embedded dielectric film (such as an STI film, a PMD film, an IMD film, or an ILD film), the resulting metal-containing film tends to have excellent filling properties into a recessed portion, as well.

In other words, when a metal-containing film is formed using the composition for forming a metal-containing film according to the present disclosure, it is possible to obtain a metal-containing film having excellent filling properties into a recessed portion.

In a case in which the composition for forming a metal-containing film according to the present disclosure contains the compound (a2) as the compound (A), in particular, a metal-containing film having more excellent filling properties into a recessed portion can be easily obtained.

The "embedded dielectric film" as used herein refers to a dielectric film which is formed in a region including a recessed portion of a member having a recessed portion by embedding (namely, filling) at least a part thereof into the recessed portion.

Examples of the recessed portion include grooves (such as trenches), and holes (such as vias).

More specifically, the recessed portion may be, for example, a recessed portion (such as an element isolation trench or a via) formed in a member by etching, a recessed portion defined by side surfaces of a plurality of conducting portions (for example, electrodes or wirings made of metal such as Cu) provided on a member and by a surface of a member, or the like.

The embedded dielectric film may be formed (filled) only inside the recessed portion, or may be formed (filled) inside the recessed portion and may further extend outside the recessed portion (over an upper portion of the recessed portion, and on a flat portion around the recessed portion).

The shallow trench isolation film (STI film) refers to a dielectric film which is formed in a trench formed in a silicon substrate, for isolating transistors on the silicon substrate.

The pre-metal dielectric film (PMD film) refers to a dielectric film which is formed between an element electrode of a transistor, a resistor, a capacitor or the like formed on a semiconductor substrate, and a metal wiring formed thereabove.

The inter-wiring layer dielectric film (IMD film: inter-metal dielectric film; or ILD film: inter-layer dielectric film) refers to a dielectric film which is formed between metal wirings.

It is to be noted that, since the composition for producing a semiconductor device disclosed in the above described WO 2015/137193 contains a product obtained by allowing a metal compound to react with hydrogen peroxide in a solvent, at least one of an amide bond, an imide bond, or an amide-imide bond is not formed in a film obtainable from the composition.

Further, since the composition for forming a metal-containing film disclosed in the above described JP-A No. 2014-134581 contains a metal alkoxide compound (such as zirconium tetraethoxide) which is capable of forming OH groups in a number equivalent to the number of valence of the metal, the formation of a polymer is facilitated by dehydration condensation in a solution. This may lead to the generation of voids and the like when filling the composition into a recessed portion, possibly causing a problem during patterning.

Descriptions will be given below regarding the components contained in the composition for forming a metal-containing film according to the present disclosure.

(Compound (A))

The composition for forming a metal-containing film according to the present disclosure includes a compound (A) which is at least one selected from the group consisting of: a compound (a1) containing a cationic functional group containing at least one of a primary nitrogen atom or a secondary nitrogen atom; and a compound (a2) which is a compound other than the compound (a1) and which contains a nitrogen atom.

The composition for forming a metal-containing film according to the present disclosure preferably contains the compound (a2) as the compound (A), from the viewpoint of obtaining a metal-containing film having more excellent filling properties into a recessed portion.

—Compound (a1)—

The compound (a1) is a compound containing a cationic functional group containing at least one of a primary nitrogen atom or a secondary nitrogen atom. The cationic functional group is not particularly limited, as long as the cationic functional group is a functional group which is capable of being positively charged, and which contains at least one of a primary nitrogen atom or a secondary nitrogen atom.

Further, the compound (a1) may contain a tertiary nitrogen atom, in addition to a primary nitrogen atom and/or a secondary nitrogen atom.

In the present specification, the term "primary nitrogen atom" refers to a nitrogen atom bound only to two hydrogen atoms and one atom other than a hydrogen atom (such as the nitrogen atom contained in a primary amino group (—$NH_2$ group)), or a nitrogen atom (cation) bound only to three hydrogen atoms and one atom other than a hydrogen atom.

Further, the term "secondary nitrogen atom" refers to a nitrogen atom bound only to one hydrogen atom and two atoms other than hydrogen atoms (namely, the nitrogen atom contained in a functional group represented by the following Formula (a)), or a nitrogen atom (cation) bound only to two hydrogen atoms and two atoms other than hydrogen atoms.

Still further, the term "tertiary nitrogen atom" refers to a nitrogen atom bound only to three atoms other than hydrogen atoms (namely, the nitrogen atom which is a functional group represented by the following Formula (b)), or a nitrogen atom (cation) bound only to one hydrogen atom and three atoms other than hydrogen atoms.

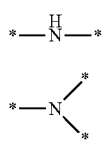

In Formula (a) and Formula (b), the symbol "*" indicates a binding position to an atom other than a hydrogen atom.

The functional group represented by the Formula (a) may be a functional group constituting a part of a secondary amino group (—$NHR^a$ group; wherein $R^a$ represents an alkyl group), or a divalent linking group included in a skeleton of a polymer.

Further, the functional group represented by the Formula (b) (namely, a tertiary nitrogen atom) may be a functional group constituting a part of a tertiary amino group (—$NR^bR^c$ group; wherein each of $R^b$ and $R^c$ independently represents an alkyl group), or a trivalent linking group contained in a skeleton of a polymer.

The compound (a1) preferably has a weight average molecular weight of from 130 to 400,000.

In the present specification, the weight average molecular weight refers to a weight average molecular weight in terms of polyethylene glycol, as measured by GPC (Gel Permeation Chromatography).

Specifically, the weight average molecular weight is calculated by: detecting a refractive index, using an aqueous solution having a sodium nitrate concentration of 0.1 mol/L as an eluent, and using an analyzer, SHODEX GPC-101, and two types of analysis columns (TSK GEL G6000 PWXL-CP and TSK GEL G3000 PWXL-CP, manufactured by Tosoh Corporation) and a reference column (TSK GEL SCX, manufactured by Tosoh Corporation), at a flow rate of 1.0 mL/min; and carrying out an analysis using polyethylene glycol as a reference standard, and using analysis software (48011 DATA STATION, manufactured by SIC).

Further, the compound (a1) may further contain an anionic functional group and/or a nonionic functional group, if necessary.

The nonionic functional group may be a hydrogen bond-accepting group or a hydrogen bond-donating group. Examples of the nonionic functional group include hydroxy group, carbonyl group, and ether group (—O—).

The anionic functional group is not particularly limited, as long as the anionic functional group is a functional group capable of being negatively charged. Examples of the anionic functional group include carboxylic acid group, sulfonic acid group, and sulfuric acid group.

The compound (a1) is preferably at least one selected from the group consisting of: an aliphatic amine (A-1) having a weight average molecular weight of from 10,000 to 200,000; a compound (A-2) containing a siloxane bond (Si—O bond) and an amino group, and having a weight average molecular weight of from 130 to 50,000; and an amine (A-3) having a ring structure and having a weight average molecular weight of from 90 to 600; from the viewpoint of facilitating the formation of a crosslinked structure between the compound (a1) and the compound (B).

This arrangement facilitates the formation of at least one of an amide bond, an imide bond, or an amide-imide bond, between the —C(=O)O— group(s) contained in the compound (B), and the cationic functional group contained in the compound (a1) and containing at least one of a primary nitrogen atom or a secondary nitrogen atom. In other words, the arrangement facilitates the formation of a crosslinked structure in the resulting metal-containing film.

(Aliphatic Amine (A-1))

The aliphatic amine (A-1) in the present disclosure is an aliphatic amine having a weight average molecular weight of from 10,000 to 200,000.

Examples of the aliphatic amine (A-1) include polyalkyleneimines, which are polymers of alkyleneimines such as: ethyleneimine, propyleneimine, butyleneimine, pentyleneimine, hexyleneimine, heptyleneimine, octyleneimine, trimethyleneimine, tetramethyleneimine, pentamethyleneimine, hexamethyleneimine, and octamethyleneimine; polyallylamine; and polyacrylamide.

Polyethyleneimine (PEI) can be produced by any of known methods such as those disclosed in Japanese Patent Publication (JP-B) No. S43-8828, JP-B No. S49-33120, JP-A No. 2001-2123958, and WO 2010/137711. Polyalkyleneimines other than polyethyleneimine can also be produced by the same methods as those used for producing polyethyleneimine.

The aliphatic amine (A-1) is also preferably a derivative of any of the polyalkyleneimines described above (a polyalkyleneimine derivative; particularly preferably a polyethyleneimine derivative). The polyalkyleneimine derivative is not particularly limited, as long as the polyalkyleneimine derivative is a compound which can be produced using any of the above described polyalkyleneimines. Specific examples of the polyalkyleneimine derivative include a polyalkyleneimine derivative obtained by introducing an alkyl group (preferably, an alkyl group having from 1 to 10 carbon atoms) or an aryl group into a polyalkyleneimine; and a polyalkyleneimine derivative obtained by introducing a crosslinkable group such as hydroxyl group into a polyalkyleneimine.

These polyalkyleneimine derivatives can be produced by ordinary methods, using the above described polyalkyleneimines. Specifically, these polyalkyleneimine derivatives can be produced in accordance with the methods disclosed, for example, in JP-A No. H06-016809 and the like.

Further, a highly branched polyalkyleneimine, which is obtained by allowing a polyalkyleneimine to react with a cationic functional group-containing monomer so as to improve the degree of branching of the polyalkyleneimine, is also preferred as the polyalkyleneimine derivative.

Examples of the method of obtaining the highly branched polyalkyleneimine include: a method in which a polyalkyleneimine having a plurality of secondary nitrogen atoms within the skeleton is allowed to react with a cationic functional group-containing monomer, so as to substitute at least some of the plurality of secondary nitrogen atoms with the cationic functional group-containing monomer; and a method in which a polyalkyleneimine having a plurality of terminal primary nitrogen atoms is allowed to react with a cationic functional group-containing monomer, so as to substitute at least some of the plurality of primary nitrogen atoms with the cationic functional group-containing monomer.

Examples of the cationic functional group to be introduced in order to improve the degree of branching include aminoethyl group, aminopropyl group, diaminopropyl group, aminobutyl group, diaminobutyl group, and triaminobutyl group. However, aminoethyl group is preferred, from the viewpoint of achieving a lower cationic functional group equivalent and a higher cationic functional group density.

Further, the polyethyleneimine and derivatives thereof may be commercially available products. For example, any of commercially available polyethyleneimines and derivatives thereof obtainable from Nippon Shokubai Co., Ltd., BASF Japan Ltd., MP-Biomedicals, and the like, can be selected and used as appropriate.

The aliphatic amine (A-1) may be used singly, or in combination of two or more kinds thereof.

(Compound (A-2) Containing Siloxane Bond (Si—O Bond) and Amino Group)

The compound (A-2) containing a siloxane bond (Si—O bond) and an amino group, in the present disclosure, is a compound having a weight average molecular weight of from 130 to 50,000.

The compound (A-2) containing a siloxane bond (Si—O bond) and an amino group (hereinafter, also referred to as the compound (A-2)) preferably has a weight average molecular weight of from 130 to 50,000, more preferably from 130 to 5,000, and still more preferably from 130 to 2,000.

The compound (A-2) may be, for example, a siloxane diamine, a silane coupling agent containing an amino group, or a siloxane polymer.

Examples of the silane coupling agent containing an amino group include N-(2-aminoethyl)-3-aminopropylmethyldimethoxysilane, N-(2-aminoethyl)-3-aminopropylmethyldiethoxysilane, N-(2-aminoethyl)-3-aminopropylmethyldipropoxysilane, N-(2-aminoethyl)-3-aminopropylmethyldiisopropoxysilane, N-(2-aminoethyl)-3-aminopropyltrimethoxysilane, N-(2-aminoethyl)-3-aminopropyltriethoxysilane, N-(2-aminoethyl)-3-aminopropyltripropoxysilane, N-(2-aminoethyl)-3-aminopropyltriisopropoxysilane, N-(2-aminoethyl)-3-aminoisobutyldimethylmethoxysilane, N-(2-aminoethyl)-3-aminoisobutylmethyldimethoxysilane, N-(2-aminoethyl)-11-aminoundecyltrimethoxysilane, 3-aminopropyltrimethoxysilane, 3-aminopropyltriethoxysilane, N-phenyl-3-aminopropyltrimethoxysilane, N,N-bis[3-(trimethoxysilyl)propyl]ethylenediamine, (aminoethylaminoethyl)phenyltrimethoxysilane, (aminoethylaminoethyl)phenyltriethoxysilane, (aminoethylaminoethyl)phenyltripropoxysilane, (aminoethylaminoethyl)phenyltriisopropoxysilane, (aminoethylaminomethyl)phenyltrimethoxysilane, (aminoethylaminomethyl)phenyltriethoxysilane, (aminoethylaminomethyl)phenyltripropoxysilane, (aminoethylaminomethyl)phenyltriisopropoxysilane, methylbenzylaminoethyl aminopropyltrimethoxysilane, dimethylbenzylaminoethyl aminopropyltrimethoxysilane, benzylaminoethyl aminopropyltrimethoxysilane, benzylaminoethyl aminopropyltriethoxysilane, 3-ureidopropyltriethoxysilane, 3-(N-phenyl)aminopropyltrimethoxysilane, (aminoethylaminoethyl)phenethyltrimethoxysilane, (aminoethylaminoethyl)phenethyltriethoxysilane, (aminoethylaminoethyl)phenethyltripropoxysilane, (aminoethylaminoethyl)phenethyltriisopropoxysilane, (aminoethylaminomethyl)phenethyltrimethoxysilane, (aminoethylaminomethyl)phenethyltriethoxysilane, (aminoethylaminomethyl)phenethyltripropoxysilane, (aminoethylaminomethyl)phenethyltriisopropoxysilane, N-[2-[3-(trimethoxysilyl)propylamino]ethyl]ethylenediamine, N-[2-[3-(triethoxysilyl)propylamino]ethyl]ethylenediamine, N-[2-[3-(tripropoxysilyl)propylamino]ethyl]ethylenediamine, N-[2-[3-(triisopropoxysilyl)propylamino]ethyl]ethylenediamine, 3-aminopropyldiethoxymethylsilane, 3-aminopropyldimethoxymethylsilane, 3-aminopropyldimethylethoxysilane, 3-aminopropyldimethylmethoxysilane, N,N'-bis[3-(trimethoxysilyl)propyl]ethylenediamine, and trimethoxy[2-(2-aminoethyl)-3-aminopropyl]silane; and hydrolyzates thereof.

The above described silane coupling agents containing an amino group may be used singly, or in combination of two or more kinds thereof. Further, the silane coupling agent containing an amino group, and a silane coupling agent which does not contain an amino group, may be used in combination. For example, a silane coupling agent containing a mercapto group may be used, in order to improve adhesion to a metal.

In addition, it is also possible to use a polymer (siloxane polymer) which is formed from any of the above described silane coupling agents, and linked through siloxane bonds (Si—O—Si). For example, a polymer having a linear siloxane structure, a polymer having a branched siloxane structure, a polymer having a cyclic siloxane structure, and a polymer having a siloxane structure in the form of a basket, or the like can be obtained, from a hydrolyzate of 3-aminopropyltrimethoxysilane. The siloxane structure in the form of a basket is represented, for example, by the following Formula (A-21):

(A-21)

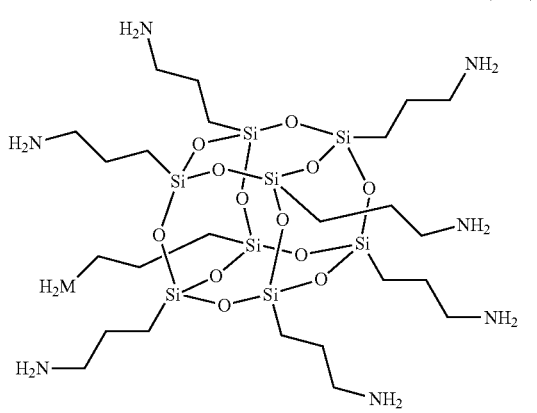

In a case in which the composition for forming a metal-containing film according to the present disclosure is required to have a plasma etching selectivity (for example, in an application as a gap filling material (an embedded planarization film), or an embedded dielectric film (such as an STI film, a PMD film, an IMD film, or an ILD film)), the composition may contain a metal alkoxide represented by Formula (I):

$$R1_nM(OR_2)_{m-n} \qquad (I)$$

(wherein R1 represents a non-hydrolyzable group; R2 represents an alkyl group having from 1 to 6 carbon atoms; M represents at least one metal atom selected from the group of metal atoms consisting of Sn, Ti, Al, Zr, Sr, Ba, Zn, B, Ga, Y, Ge, Pb, P, Sb, V, Ta, W, La, Nd, Hf and In; m represents the valence of the metal atom M, which is 3 or 4; n represents an integer of from 0 to 2 when m is 4, and n represents 0 or 1 when m is 3; in a case in which a plurality of R1s are present, each of R1s may be the same as, or different from, each other; and in a case in which a plurality of OR2s are present, each of OR2s may be the same as, or different from, each other.) In the Formula (I), n is preferably 1 or more.

In a case in which a film formed from the composition for forming a metal-containing film according to the present disclosure is required to have insulation properties (for example, in an application as an embedded dielectric film (such as an STI film, a PMD film, an IMD film, or an ILD film)), tetraethoxysilane, tetramethoxysilane, bistriethoxysilylethane, and/or bistriethoxysilyl methane may be mixed to the composition, in order to improve the insulation properties or mechanical strength. Further, methyltriethoxysilane, dimethyldiethoxysilane, trimethylethoxysilane and/or the like may be mixed to the composition, in order to improve the hydrophobicity of the dielectric film.

Examples of the siloxane diamine include a compound represented by the following Formula (A-22). In Formula (A-22), i represents an integer from 0 to 4; and j represents 0 or 1.

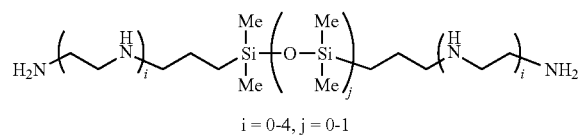

i = 0-4, j = 0-1

Specifically, examples of the siloxane diamine include 1,3-bis(3-aminopropyl)tetramethyldisiloxane (a compound, wherein in Formula (A-22), i is 0; and j is 1), and 1,3-bis (2-aminoethylamino)propyltetramethyldisiloxane (a compound, wherein in Formula (A-22), i is 1; and j is 1).

The compound containing a siloxane bond (Si—O bond) and an amino group may be used singly, or in combination of two or more kinds thereof.

(Amine (A-3) Having Ring Structure)

The amine (A-3) having a ring structure (hereinafter, also referred to as the compound (A-3)), in the present disclosure, is an amine having a ring structure and having a weight average molecular weight of from 90 to 600. The compound (A-3) preferably has a weight average molecular weight of from 90 to 300.

Examples of the compound (A-3) include primary amines and secondary amines having a ring structure. The compound (A-3) is preferably an alicyclic amine, an aromatic amine, or a heterocyclic amine. The compound (A-3) may have a plurality of ring structures within the molecule, and the plurality of ring structures may be the same as, or different from, each other.

The compound (A-3) is more preferably an aromatic amine, because the aromatic amine facilitates obtaining a compound which is thermally more stable.

Examples of the aromatic amine include aromatic amines having from 6 to 15 carbon atoms in total, and araliphatic amines having from 6 to 15 carbon atoms in total.

The compound (A-3) is preferably a diamine compound containing two primary amino groups, or a triamine compound containing three primary amino groups, from the viewpoint of facilitating an increase in the number of thermally crosslinked structures, such as amide structures, and further improving the heat resistance.

Further, in a case in which a crosslinking agent (D) to be described later is used, for example, the compound (A-3) is preferably a diamine compound containing two primary amino groups, or a triamine compound containing three primary amino groups, from the viewpoint of facilitating an increase in the number of thermally crosslinked structures, such as imide structures, imide-amide structures, and amide structures, and further improving the heat resistance.

Examples of the alicyclic amine include cyclohexylamine, and N-methylcyclohexyl amine.

Examples of the aromatic amine include diaminodiphenyl ether, xylene diamine (preferably, paraxylene diamine), diaminobenzene, diaminotoluene, methylenedianiline, dimethyldiaminobiphenyl, bis(trifluoromethyl)diaminobiphenyl, diaminobenzophenone, diaminobenzanilide, bis(aminophenyl)fluorene, bis(aminophenoxy)benzene, bis (aminophenoxy)biphenyl, dicarboxydiaminodiphenylmethane, diaminoresorcin, dihydroxybenzidine, diaminobenzidine, 1,3,5-triaminophenoxy benzene, 2,2'-dimethylbenzidine, tris(4-aminophenyl) amine, 2,7-diaminofluorene, 1,9-diaminofluorene, and dibenzylamine.

Examples of the heterocyclic amine include: a heterocyclic amine having a heterocyclic structure containing a nitrogen atom; a heterocyclic amine having a heterocyclic structure containing a sulfur atom; and an amine compound having both a heterocyclic structure and an aromatic ring structure other than an aromatic heterocyclic ring.

Examples of the heterocyclic amine having a heterocyclic structure containing a nitrogen atom include melamine, ammeline, melam, and melem. Examples of the heterocyclic amine having a heterocyclic structure containing a sulfur atom include 5-thiazoleamine, and 2-aminobenzothiazole.

Examples of the amine compound having both a heterocyclic structure and an aromatic ring structure other than an aromatic heterocyclic ring include N2,N4,N6-tris(4-aminophenyl)-1,3,5-triazine-2,4,6-triamine, and 2,4-diamino-6-phenyl-1,3,5-triazine.

The amine (A-3) having a ring structure may be used singly, or in combination of two or more kinds thereof.

As described above, the compound (a1) contains a cationic functional group containing at least one of a primary nitrogen atom or a secondary nitrogen atom.

In a case in which the compound (a1) contains a primary nitrogen atom, the ratio of the amount of primary nitrogen atoms with respect to the total amount of nitrogen atoms contained in the compound (a1) is preferably 20% by mole or more, more preferably 25% by mole or more, and still more preferably 30% by mole or more. Further, the compound (a1) may contain a cationic functional group which contains a primary nitrogen atom, and which does not contain a nitrogen atom other than a primary nitrogen atom (such as a secondary nitrogen atom, a tertiary nitrogen atom, etc.).

In a case in which the compound (a1) contains a secondary nitrogen atom, the ratio of the amount of the secondary nitrogen atoms with respect to the total amount of nitrogen atoms contained in the compound (a1) is preferably from 5% by mole to 50% by mole, and more preferably from 10% by mole to 45% by mole.

The compound (a1) may contain a tertiary nitrogen atom, in addition to a primary nitrogen atom and/or a secondary nitrogen atom. In a case in which the compound (a1) contains a tertiary nitrogen atom, the ratio of the amount of tertiary nitrogen atoms with respect to the total amount of nitrogen atoms contained in the compound (a1) is preferably from 20% by mole to 50% by mole, and more preferably from 25% by mole to 45% by mole.

In the present disclosure, the content of the compound (a1) in the composition for forming a metal-containing film is not particularly limited. The content of the compound (a1) is, for example, from 0.001% by mass to 20% by mass, preferably from 0.01% by mass to 10% by mass, and more preferably from 0.04% by mass to 5% by mass, with respect to the total amount of the composition.

The compound (a1) may also be a mixture of at least two or more selected from the group consisting of the aliphatic amine (A-1), the compound (A-2) containing a siloxane bond (Si—O bond) and an amino group, and the amine (A-3) having a ring structure, described above.

—Compound (a2)—

The compound (a2) is a compound which is other than the compound (a1) and which contains a nitrogen atom.

The compound (a2) is preferably a base (A-4) having a weight average molecular weight of from 17 to 120, from the viewpoint of facilitating the formation of a salt between the compound (a2) and the compound (B).

The method of measuring the weight average molecular weight of the compound (a2) is the same as that described in the section of the compound (a1).

In a case in which the composition for forming a metal-containing film according to the present disclosure contains, for example, both the base (A-4) and the compound (a1) as the compound (A), it is assumed that aggregation due to the association between the compound (a1) and the compound (B) is prevented, as a result of a carboxy group in the compound (B) and an amino group in the base (A-4) forming an ionic bond. More specifically, the interaction between a carboxylate ion derived from a carboxy group in the compound (B) and an ammonium ion derived from an amino group in the base (A-4) is stronger than the interaction between an ammonium ion derived from an amino group in the compound (a1) and a carboxylate ion derived from a carboxy group in the compound (B), and this is assumed to result in the prevention of aggregation. It is to be noted, however, that the present disclosure is in no way limited by the above described assumption.

The base (A-4) is not particularly limited, as long as the base (A-4) is a compound containing a nitrogen atom and having a weight average molecular weight of from 17 to 120, and examples thereof include monoamine compounds and diamine compounds.

Specific examples of the base (A-4) include ammonia, ammonium salts, ethylamine, ethanolamine, diethylamine, triethylamine, ethylenediamine, N-acetylethylenediamine, N-(2-aminoethyl)ethanolamine, and N-(2-aminoethyl)glycine.

In a case in which the composition for forming a metal-containing film according to the present disclosure contains the base (A-4) as the compound (A), the content of the base (A-4) in the composition for forming a metal-containing film is not particularly limited. For example, it is preferred that the ratio (N/COOH) of the number of nitrogen atoms in the base (A-4) with respect to the number of carboxy groups in the compound (B) is from 0.5 to 5, more preferably from 0.7 to 3, and still more preferably from 0.9 to 3.

The content of the compound (A) in the composition for forming a metal-containing film can be adjusted to from 0.001% by mass to 20% by mass, preferably from 0.01% by mass to 10% by mass, and more preferably from 0.04% by mass to 5% by mass, with respect to the total amount of the composition.

Further, the compound (A) may also be a mixture of at least two or more selected from the group consisting of the aliphatic amine (A-1), the compound containing a siloxane bond (Si—O bond) and an amino group, the amine (A-3) having a ring structure, and the base (A-4), described above.

(Compound (B))

The composition for forming a metal-containing film according to the present disclosure includes a compound (B) which is at least one selected from the group consisting of: a compound (b1) containing at least one of a germanium atom, a tin atom, a selenium atom or a zirconium atom, and a carboxy group; and an ester of the compound (b1).

The compound (B) may contain two or more of the same kind of metal atoms selected from the group consisting of a germanium atom, a tin atom, a selenium atom, and a zirconium atom.

An ester of the compound (b1) refers to an ester compound obtained by a dehydration condensation reaction of the compound (b1), which is a carboxylic acid, with an alcohol. The alcohol is not particularly limited, and examples thereof include an alcohol having from 1 to 10 carbon atoms (the alcohol may be any of a linear, branched, or cyclic alcohol). The alkyl group in the alcohol may have a substituent.

The compound (b1) and an ester of the compound (b1) may be used singly, or in combination of two or more kinds thereof.

The compound (B) preferably has a weight average molecular weight of from 120 to 50,000, more preferably from 150 to 10,000, still more preferably from 150 to 1,000, and particularly preferably from 150 to 600, from the viewpoint of facilitating the formation of a crosslinked structure between the compound (B) and the compound (a1), facilitating the formation of a salt between the compound (B) and the compound (a2), and realizing favorable filling properties into a recessed portion (microtrench).

More specifically, in a case in which the compound (B) is a compound other than a polymer, the compound (B) preferably has a weight average molecular weight of from 120 to 10,000, more preferably from 150 to 1000, and still more preferably from 150 to 600.

In a case in which the compound (B) is a polymer, the compound (B) preferably has a weight average molecular weight of from 200 to 50,000, more preferably from 300 to 10,000, and still more preferably from 500 to 2,000.

The compound (b1) is preferably a compound represented by the following Formula (1) or the following Formula (2), or a polymer containing at least one of a structural unit represented by the following Formula (3) or a structural unit represented by the following Formula (4).

(Compound Represented by Formula (1))

The compound (b1) is preferably a compound represented by the following Formula

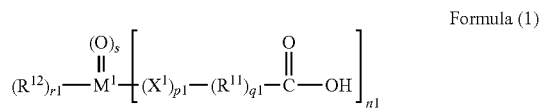

Formula (1)

In Formula (1), $M^1$ represents a germanium atom, a tin atom, a selenium atom, or a zirconium atom.

In Formula (1), $X^1$ represents —S—, —S—S—, —O—, —NH—, or —NR$^{13}$—; and $R^{13}$ represents an alkyl group having from 1 to 10 carbon atoms.

In Formula (1), $R^{11}$ represents an optionally substituted alkylene group having from 1 to 10 carbon atoms.

In Formula (1), $R^{12}$ represents a hydrogen atom, an alkyl group having from 1 to 5 carbon atoms, a hydroxy group, an alkoxy group having from 1 to 5 carbon atoms, or a halogen atom.

In Formula (1), p1 represents 0 or 1; and q1 represents 0 or 1.

In Formula (1), n1 represents an integer of 1 or more; r1 represents an integer of 0 or more; and s represents an integer of 0 or more; with the proviso that the sum of n1+r1+2s is the valence of $M^1$.

Specific examples of the "alkyl group having from 1 to 10 carbon atoms" represented by $R^{13}$ in Formula (1) include methyl group, ethyl group, propyl group, butyl group, pentyl group, hexyl group, heptyl group, octyl group, nonyl group, and decyl group (the alkyl group may be any of a linear, branched, or cyclic group.

Specific examples of the "alkylene group having from 1 to 10 carbon atoms" represented by $R^{11}$ in Formula (1) include methylene group, ethylene group, propylene group, butylene group, pentylene group, hexylene group, heptylene group, octylene group, nonylene group, and decalene group (the alkylene group may be any of a linear, branched, or cyclic group).

Specific examples of the "alkyl group having from 1 to 5 carbon atoms" represented by $R^{12}$ in Formula (1) include methyl group, ethyl group, propyl group, butyl group, and pentyl group (the alkyl group may be any of a linear, branched, or cyclic group). Further, specific examples of the "alkoxy group having from 1 to 5 carbon atoms" represented by $R^{12}$ include methoxy group, ethoxy group, propoxy group, butoxy group, and pentyloxy group (the alkoxy group may be any of a linear, branched, or cyclic group).

Examples of the substituent in the "optionally substituted alkylene group having from 1 to 10 carbon atoms" represented by $R^H$ in Formula (1) include one or more substituents selected from the group consisting of amino group, carboxyamino group, alkoxy group, alkylamino group, and carbamoyl group. In a case in which two or more substituents are present, the substituents may be the same as, or different from, each other.

In Formula (1), $M^1$ represents a germanium atom, a tin atom, a selenium atom, or a zirconium atom. $M^1$ is preferably a germanium atom, a tin atom, or a selenium atom, and more preferably a germanium atom.

In Formula (1), $X^1$ represents —S—, —S—S—, —O—, —NH—, or —NR$^{13}$—; and $R^{13}$ represents an alkyl group having from 1 to 10 carbon atoms. $X^1$ is preferably —O—, —NH—, or —NR$^{13}$—. $R^{13}$ is preferably an alkyl group having from 1 to 6 carbon atoms.

In Formula (1), $R^{11}$ represents an optionally substituted alkylene group having from 1 to 10 carbon atoms. $R^{11}$ is preferably an alkylene group having from 1 to 6 carbon atoms. An amino group or a carboxyamino group is preferred as a substituent in the "optionally substituted alkylene group having from 1 to 10 carbon atoms" represented by $R^H$.

In Formula (1), $R^{12}$ represents a hydrogen atom, an alkyl group having from 1 to 5 carbon atoms, a hydroxy group, an alkoxy group having from 1 to 5 carbon atoms, or a halogen atom. $R^{12}$ is preferably an alkyl group having from 1 to 3 carbon atoms.

In Formula (1), p1 represents 0 or 1; and q1 represents 0 or 1. p1 is preferably 0, from the viewpoint of securing the stability of the compound (B) in a solution (namely, making the compound less susceptible to polymerization by hydrolysis etc.). q1 is preferably 1.

Further, in Formula (1), in a case in which $M^1$ is a germanium atom, a tin atom, or a zirconium atom, the sum of n1+r1+2s is preferably 4. In a case in which $M^1$ is a selenium atom, the sum of n1+r1+2s is preferably 2.

Specific embodiments of the compound (compound (b1)) represented by the following Formula (1) include the following embodiments 1) to 6).

1) An embodiment wherein, in Formula (1), $M^1$ is at least one of a germanium atom, a tin atom, or a selenium atom.

2) An embodiment wherein, in Formula (1), $M^1$ is at least one of a germanium atom, a tin atom, or a selenium atom; p1 is 0; and q1 is 1.

3) An embodiment wherein, in Formula (1), $M^1$ is at least one of a germanium atom, a tin atom, or a selenium atom; and n1 is 2 or more (with the proviso that p1 is 0, and q1 is 1).

4) An embodiment wherein, in Formula (1), $M^1$ is at least one of a germanium atom, a tin atom, or a selenium atom; n1 is 2 or more (with the proviso that p1 is 0, and q1 is 1), and a sulfur atom is not contained within the molecule.

5) An embodiment wherein, in Formula (1), $M^1$ is a germanium atom; n1 is 2 or more (with the proviso that p1 is 0, and q1 is 1), and a sulfur atom is not contained within the molecule.

6) An embodiment in which a hydroxy group(s) is/are not directly bound to $M^1$ in any of the above described embodiments 1) to 5).

Preferred specific examples of the compound represented by Formula (1), as the compound (b1), are shown below, but not particularly limited thereto.

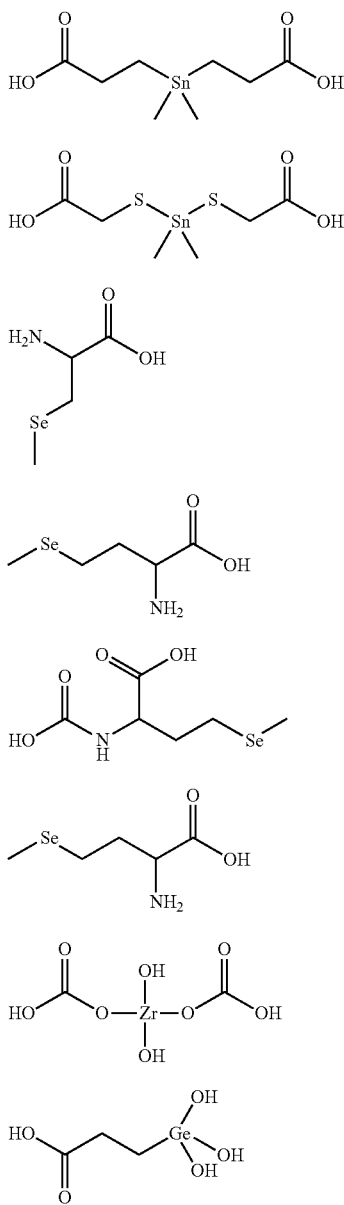

(Compound Represented by Formula (2))

The compound (b1) is preferably a compound represented by the following Formula (2).

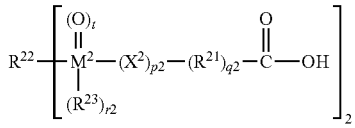

In Formula (2), $M^2$ represents a germanium atom, a tin atom, a selenium atom, or a zirconium atom.

In Formula (2), $X^2$ represents —S—, —S—S—, —O—, —NH—, or —NR$^{24}$—; and R$^{24}$ represents an alkyl group having from 1 to 10 carbon atoms.

In Formula (2), R$^{21}$ represents an optionally substituted alkylene group having from 1 to 10 carbon atoms.

In Formula (2), R$^{22}$ represents a single bond, —O—, or —NR$^{25}$—; and R$^{25}$ represents an optionally substituted alkyl group having from 1 to 10 carbon atoms.

In Formula (2), R$^{23}$ represents a hydrogen atom, an alkyl group having from 1 to 5 carbon atoms, a hydroxy group, an alkoxy group having from 1 to 5 carbon atoms, or a halogen atom.

In Formula (2), p2 represents 0 or 1; and q2 represents 0 or 1.

In Formula (2), r2 represents an integer of 0 or more; and t represents an integer of 0 or more; with the proviso that the sum of r2+2t+2 is the valence of $M^2$.

In Formula (2), the definition of the "alkyl group having from 1 to 10 carbon atoms" represented by R$^{24}$ and that of the "alkyl group having from 1 to 10 carbon atoms" in the "optionally substituted alkyl group having from 1 to 10 carbon atoms" represented by R$^{25}$ are each the same as the definition of the "alkyl group having from 1 to 10 carbon atoms" represented by R$^{13}$ in Formula (1).

In Formula (2), the definition of the "alkylene group having from 1 to 10 carbon atoms" represented by R$^{21}$ is the same as the definition of the "alkylene group having from 1 to 10 carbon atoms" represented by in Formula (1).

In Formula (2), the definition of the "alkyl group having from 1 to 5 carbon atoms" represented by R$^{23}$ is the same as the definition of the "alkyl group having from 1 to 5 carbon atoms" represented by R$^{12}$ in Formula (1).

In Formula (2), the definition of the "alkoxy group having from 1 to 5 carbon atoms" represented by R$^{23}$ is the same as the definition of the "alkoxy group having from 1 to 5 carbon atoms" represented by R$^{12}$ in Formula (1).

Examples of the substituent in the "optionally substituted alkylene group having from 1 to 10 carbon atoms" represented by R$^{21}$ in Formula (2) include one or more substituents selected from the group consisting of amino group, carboxyamino group, alkoxy group, alkylamino group, and carbamoyl group. In a case in which two or more substituents are present, the substituents may be the same as, or different from, each other.

Examples of the substituent in the "optionally substituted alkyl group having from 1 to 10 carbon atoms" represented by R$^{25}$ in Formula (2) include a group represented by the following Formula (c). In the group represented by Formula (c), the symbol "*" indicates a binding position. A compound (B-23), which is one of the preferred specific examples of the compound represented by Formula (2) to be described later, is a compound containing the group represented by the following Formula (c).

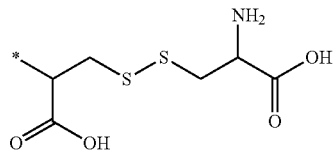

In Formula (2), $M^2$ represents a germanium atom, a tin atom, a selenium atom, or a zirconium atom. $M^2$ is preferably a germanium atom, a tin atom, or a selenium atom, and more preferably a germanium atom.

In Formula (2), $X^2$ represents —S—, —S—S—, —O—, —NH—, or —NR$^{24}$—; and R$^{24}$ represents an alkyl group having from 1 to 10 carbon atoms. $X^2$ is preferably —O—, —NH—, or —NR$^{24}$—. R$^{24}$ is preferably an alkyl group having from 1 to 6 carbon atoms.

In Formula (2), R$^{21}$ represents an optionally substituted alkylene group having from 1 to 10 carbon atoms. R$^{21}$ is preferably an alkylene group having from 1 to 6 carbon atoms. An amino group or a carboxyamino group is preferred as a substituent in the "optionally substituted alkylene group having from 1 to 10 carbon atoms" represented by R$^{21}$.

In Formula (2), R$^{22}$ represents a single bond, —O—, or —NR$^{25}$—; and R$^{25}$ represents an optionally substituted alkyl group having from 1 to 10 carbon atoms. R$^{22}$ is preferably —O—.

In Formula (2), R$^{23}$ represents a hydrogen atom, an alkyl group having from 1 to 5 carbon atoms, a hydroxy group, an alkoxy group having from 1 to 5 carbon atoms, or a halogen atom. R$^{23}$ is preferably an alkyl group having from 1 to 3 carbon atoms.

In Formula (2), p2 represents 0 or 1; and q2 represents 0 or 1. p2 is preferably 0. q2 is preferably 1.

Further, in Formula (2), in a case in which M$^2$ is a germanium atom, a tin atom, or a zirconium atom, the sum of r2+2t+2 is preferably 4; and in a case in which the M$^2$ is a selenium atom, the sum of r2+2t+2 is preferably 2.

Specific embodiments of the compound (compound (b1)) represented by the following Formula (2) include the following embodiments 1) to 5).

1) An embodiment wherein, in Formula (2), M$^2$ is at least one of a germanium atom, a tin atom, or a selenium atom.

2) An embodiment wherein, in Formula (2), M$^2$ is at least one of a germanium atom, a tin atom, or a selenium atom; p2 is 0; and q2 is 1.

3) An embodiment wherein, in Formula (2), M$^2$ is at least one of a germanium atom, a tin atom, or a selenium atom; p2 is 0; q2 is 1; and a sulfur atom is not contained within the molecule.

4) An embodiment wherein, in Formula (2), M$^2$ is a germanium atom; p2 is 0; q2 is 1; and a sulfur atom is not contained within the molecule.

5) An embodiment in which a hydroxy group(s) is/are not directly bound to M$^2$ in any of the above described embodiments 1) to 4).

Preferred specific examples of the compound represented by Formula (2), as the compound (b1), are shown below, but not particularly limited thereto. Among these, a compound represented by Formula (B-21) is preferred, from the viewpoint of obtaining a metal-containing film having further improved etching selectivity and heat resistance.

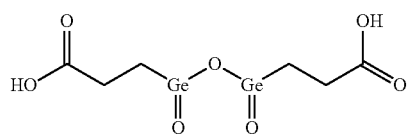

(B-21)

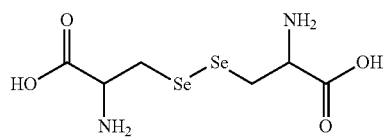

(B-22)

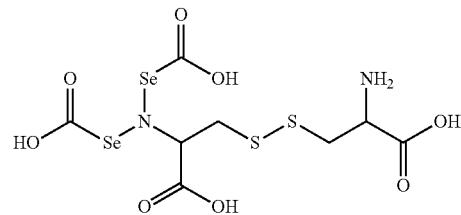

(B-23)

(Polymer Containing Structural Unit Represented by Formula (3))

The compound (b1) is preferably a polymer containing a structural unit represented by the following Formula (3).

The polymer containing a structural unit represented by the following Formula (3) can be obtained, for example, from the compound represented by Formula (1). Specifically, it is possible to obtain from the compound represented by Formula (1), a polymer, such as a linear polymer, a polymer having a basket-like structure, or a polymer having a dendritic structure, which is linked, for example, through M-O-M bonds (M represents one selected from the group consisting of a germanium atom, a tin atom, and a zirconium atom). The shape of the thus obtained polymer is not particularly limited, and the polymer may be a linear polymer, a polymer having basket-like structure, or a polymer having a dendritic structure.

Further, the polymer containing a structural unit represented by Formula (3) may be a polymer of a plurality of metal compounds. In other words, the polymer containing a structural unit represented by Formula (3) may be a polymer containing different kinds of metal atoms selected from the group consisting of a germanium atom, a tin atom, and a zirconium atom.

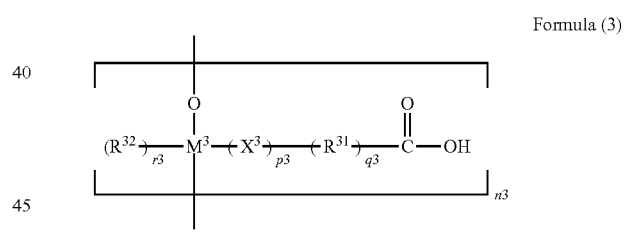

Formula (3)

In Formula (3), M$^3$ represents a germanium atom, a tin atom, or a zirconium atom.

In Formula (3), X$^3$ represents —S—, —S—S—, —O—, —NH—, or —NR$^{33}$—; and R$^{33}$ represents an alkyl group having from 1 to 10 carbon atoms.

In Formula (3), R$^{31}$ represents an optionally substituted alkylene group having from 1 to 10 carbon atoms.

In Formula (3), R$^{32}$ represents a hydrogen atom, an alkyl group having from 1 to 5 carbon atoms, a hydroxy group, an alkoxy group having from 1 to 5 carbon atoms, or a halogen atom.

In Formula (3), p3 represents 0 or 1; and q3 represents 0 or 1.

In Formula (3), r3 represents 0 or 1, and in a case in which r3 is 0, R$^{32}$ represents a bond.

In Formula (3), n3 represents an integer of 2 or more.

The definition of the "alkyl group having from 1 to 10 carbon atoms" represented by R$^{33}$ in Formula (3) is the same as the definition of the "alkyl group having from 1 to 10 carbon atoms" represented by R$^{13}$ in Formula (1).

The definition of the "alkylene group having from 1 to 10 carbon atoms" represented by $R^{31}$ in Formula (3) is the same as the definition of the "alkylene group having from 1 to 10 carbon atoms" represented by $R^{11}$ in Formula (1).

The definition of the "alkyl group having from 1 to 5 carbon atoms" represented by $R^{32}$ in Formula (3) is the same as the definition of the "alkyl group having from 1 to 5 carbon atoms" represented by $R^{12}$ in Formula (1).

The definition of the "alkoxy group having from 1 to 5 carbon atoms" represented by $R^{32}$ in Formula (3) is the same as the definition of the "alkoxy group having from 1 to 5 carbon atoms" represented by $R^{12}$ in Formula (1).

Examples of the substituent in "optionally substituted alkylene group having from 1 to 10 carbon atoms" represented by $R^{31}$ in the Formula (3) include one or more substituents selected from the group consisting of amino group, carboxyamino group, alkoxy group, alkylamino group, and carbamoyl group. In a case in which two or more substituents are present, the substituents may be the same as, or different from, each other.

In Formula (3), $M^1$ is preferably a germanium atom or a tin atom, and more preferably a germanium atom.

In Formula (3), $X^3$ is preferably —O—, —NH—, or —$NR^{33}$—.

In Formula (3), $R^{33}$ is preferably an alkyl group having from 1 to 6 carbon atoms.

In Formula (3), $R^{31}$ is preferably an alkylene group having from 1 to 6 carbon atoms, and an amino group or a carboxyamino group is preferred as a substituent in the "optionally substituted alkylene group having from 1 to 10 carbon atoms" represented by $R^{31}$.

In Formula (3), $R^{32}$ is preferably an alkyl group having from 1 to 3 carbon atoms.

In Formula (3), p3 is preferably 0. q3 is preferably 1.

In Formula (3), r3 is preferably 1.

In Formula (3), n3 is preferably from 2 to 250.

Preferred specific examples of the polymer containing a structural unit represented by Formula (3), as the compound (b1), include a polymer containing a structural unit represented by any of the following Formulae (3A) and (3B), but not limited thereto.

In Formula (3A), n is preferably from 2 to 130.
In Formula (3B), n is preferably from 2 to 130.

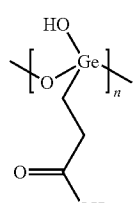

Formula (3A)

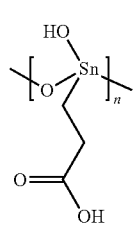

Formula (3B)

(Polymer Containing Structural Unit Represented by Formula (4))

The compound (b1) is preferably a polymer containing a structural unit represented by the following Formula (4).

The polymer containing a structural unit represented by the following Formula (4) can be obtained, for example, from the compound represented by Formula (2). Specifically, it is possible to obtain from the compound represented by Formula (2), a polymer such as a linear polymer, which is linked, for example, through M-O-M bonds (M represents one selected from the group consisting of a germanium atom, a tin atom, and a zirconium atom). The shape of the thus obtained polymer is not particularly limited.

Further, the polymer containing a structural unit represented by Formula (4) may be a polymer of a plurality of metal compounds. In other words, the polymer containing a structural unit represented by Formula (4) may be a polymer containing different kinds of metal atoms selected from the group consisting of a germanium atom, a tin atom, and a zirconium atom.

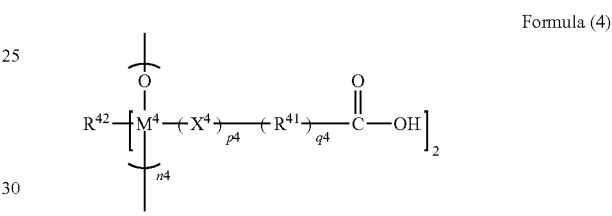

Formula (4)

In Formula (4), $M^4$ represents a germanium atom, a tin atom, or a zirconium atom.

In Formula (4), $X^4$ represents —S—, —S—S—, —O—, —NH—, or —$NR^{43}$—; and $R^{43}$ represents an alkyl group having from 1 to 10 carbon atoms.

In Formula (4), $R^{41}$ represents an optionally substituted alkylene group having from 1 to 10 carbon atoms.

In Formula (4), $R^{42}$ represents a single bond, —O—, or —$NR^{44}$—; and $R^{44}$ represents an optionally substituted alkyl group having from 1 to 10 carbon atoms.

In Formula (4), p4 represents 0 or 1, and q4 represents 0 or 1.

In Formula (4), n4 represents an integer of 2 or more.

In Formula (4), the definition of the "alkyl group having from 1 to 10 carbon atoms" represented by $R^{43}$ and that of the "alkyl group having from 1 to 10 carbon atoms" in the "optionally substituted alkyl group having from 1 to 10 carbon atoms" represented by $R^{44}$ are each the same as the definition of the "alkyl group having from 1 to 10 carbon atoms" represented by $R^{13}$ in Formula (1).

In Formula (4), the definition of the "alkylene group having from 1 to 10 carbon atoms" represented by $R^{41}$ is the same as the definition of the "alkylene group having from 1 to 10 carbon atoms" represented by $R^{41}$ in Formula (1).

Examples of the substituent in the "optionally substituted alkylene group having from 1 to 10 carbon atoms" represented by $R^{41}$ in Formula (4) include one or more substituents selected from the group consisting of amino group, carboxyamino group, alkoxy group, alkylamino group, and carbamoyl group. In a case in which two or more substituents are present, the substituents may be the same as, or different from, each other.

Examples of the substituent in the "optionally substituted alkyl group having from 1 to 10 carbon atoms" represented by $R^{44}$ in Formula (4) include a group represented by the above described Formula (c). In the group represented by Formula (c), the symbol "*" indicates a binding position.

In Formula (4), $M^4$ is preferably a germanium atom or a tin atom, and more preferably a germanium atom.

In Formula (4), $X^4$ is preferably —O—, —NH—, or —$NR^{43}$—.

In Formula (4), $R^{43}$ is preferably an alkyl group having from 1 to 6 carbon atoms.

In Formula (4), $R^{41}$ is preferably an alkylene group having from 1 to 6 carbon atoms; and an amino group or a carboxyamino group is preferred as a substituent in the "optionally substituted alkylene group having from 1 to 10 carbon atoms" represented by $R^{41}$.

In Formula (4), $R^{42}$ is preferably —O—.

In Formula (4), p4 is preferably 0. q4 is preferably 1.

In Formula (4), n4 is preferably from 2 to 130.

Preferred specific examples of the polymer containing a structural unit represented by Formula (4), as the compound (b1), include a polymer containing a structural unit represented by any of the following Formulae (4A) to (4B), but not limited thereto.

The polymer containing a structural unit represented by the following Formula (4A) is an example of a polymer of a compound represented by the compound (B-21). In Formula (4A), n is preferably from 2 to 130.

In Formula (4B), n is preferably from 2 to 130.

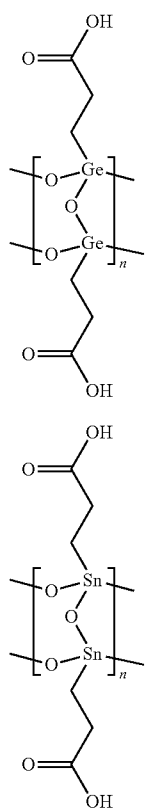

Formula (4A)

Formula (4B)

The content of the compound (B) in the composition for forming a metal-containing film is preferably from 0.1% by mass to 15%, and more preferably from 0.5% by mass to 10% by mass, with respect to the total amount of the composition.

(Additive (C))

It is preferred that the composition for forming a metal-containing film according to the present disclosure further contains an additive (C) which is an acid containing a carboxy group and having a weight average molecular weight of from 46 to 195, from the viewpoint of obtaining a metal-containing film having further improved etching selectivity and heat resistance.

The acid as the additive (C) is an acid containing a carboxy group and having a weight average molecular weight of from 46 to 195. When the composition for forming a metal-containing film according to the present disclosure contains the additive (C), it is assumed that aggregation due to the association between the compound (A) and the compound (B) is prevented, for example, as a result of an amino group contained in the compound (A) and a carboxy group in the above described acid (additive (C)) forming an ionic bond. More specifically, the interaction (such as an electrostatic interaction) between an ammonium ion derived from an amino group in the compound (A) and a carboxylate ion derived from a carboxy group in the acid (additive (C)) is stronger than the interaction between an ammonium ion derived from an amino group in the compound (A) and a carboxylate ion derived from a carboxy group in the compound (B), and this is assumed to result in the prevention of aggregation. It is to be noted, however, that the present disclosure is in no way limited by the above described assumption.

The acid (additive (C)) is not particularly limited, as long as the acid contains a carboxy group and has a weight average molecular weight of from 46 to 195. Examples of the acid include monocarboxylic acid compounds, dicarboxylic acid compounds, and oxydicarboxylic acid compounds. More specific examples of the acid (additive (C)) include formic acid, acetic acid, malonic acid, oxalic acid, citric acid, benzoic acid, lactic acid, glycolic acid, glyceric acid, butyric acid, methoxyacetic acid, ethoxyacetic acid, phthalic acid, terephthalic acid, picolinic acid, salicylic acid, and 3,4,5-trihydroxybenzoic acid.

In the present disclosure, the content of the additive (C) in the composition for forming a metal-containing film is not particularly limited. For example, it is preferred that the ratio (COOH/N) of the number of carboxy groups in an acid (C-1) with respect to the total number of nitrogen atoms in the compound (A) is from 0.01 to 10, and more preferably from 0.02 to 6, and still more preferably from 0.02 to 1.

(Crosslinking Agent (D))

The composition for forming a metal-containing film according to the present disclosure may further contain a crosslinking agent (D) which contains three or more —C(=O)OX groups (wherein each X represents a hydrogen atom or an alkyl group having from 1 to 6 carbon atoms) within the molecule, wherein from one to six of the three or more —C(=O)OX groups (hereinafter, also referred to as "COOX") is/are —C(=O)OH group(s) (hereinafter, also referred to as "COOH"), and which has a weight average molecular weight of from 200 to 600, from the viewpoint of obtaining a metal-containing film having further improved etching selectivity and heat resistance.

The crosslinking agent (D) is a compound containing three or more —C(=O)OX groups (wherein each X represents a hydrogen atom or an alkyl group having from 1 to 6 carbon atoms) within the molecule. However, the crosslinking agent (D) is preferably a compound containing from three to six —C(=O)OX groups within the molecule, and more preferably a compound containing three or four —C(=O)OX groups within the molecule.

In the crosslinking agent (D), each X in the —C(=O)OX groups may be, for example, a hydrogen atom or an alkyl group having from 1 to 6 carbon atoms. Among these, each X is preferably a hydrogen atom, a methyl group, an ethyl group, or a propyl group. Xs in the —C(=O)OX groups may be the same as, or different from, each other.

The crosslinking agent (D) is a compound having from one to six —C(=O)OH groups, wherein each X is a hydrogen atom, within the molecule. However, the crosslinking agent (D) is preferably a compound containing from one to four —C(=O)OH groups within the molecule, more preferably a compound containing from two to four —C(=O)OH groups within the molecule, and still more preferably a compound containing two or three —C(=O)OH groups within the molecule.

The crosslinking agent (D) is a compound having a weight average molecular weight of from 200 to 600. The crosslinking agent (D) is preferably a compound having a weight average molecular weight of from 200 to 400.

The crosslinking agent (D) preferably has a ring structure within the molecule. Examples of the ring structure include an alicyclic structure, and an aromatic ring structure. Further, the crosslinking agent (D) may have a plurality of ring structures within the molecule, and the plurality of ring structures may be the same as, or different from, each other.

The alicyclic structure may be, for example, an alicyclic structure having from 3 to 8 carbon atoms, and preferably an alicyclic structure having from 4 to 6 carbon atoms. The ring structure may be a saturated or unsaturated ring structure. More specific examples of the alicyclic structure include saturated alicyclic structures such as cyclopropane ring, cyclobutane ring, cyclopentane ring, cyclohexane ring, cycloheptane ring, and cyclooctane ring; and unsaturated alicyclic structures such as cyclopropene ring, cyclobutene ring, cyclopentene ring, cyclohexene ring, cycloheptene ring, and cyclooctene ring.

The aromatic ring structure is not particularly limited, as long as the ring structure exhibits aromaticity. Examples of the aromatic ring structure include benzene aromatic rings such as benzene ring and naphthalene ring; aromatic heterocyclic rings such as pyridine ring and thiophene ring; and non-benzene aromatic rings such as indene ring and azulene ring.

The ring structure in the molecule of the crosslinking agent (D) is preferably at least one selected from the group consisting of, for example, cyclobutane ring, cyclopentane ring, cyclohexane ring, benzene ring, and naphthalene ring. From the viewpoint of further improving the heat resistance of a film obtained from the composition for forming a metal-containing film, the ring structure is more preferably at least one of benzene ring or naphthalene ring.

As described above, the crosslinking agent (D) may contain a plurality of ring structures within the molecule, and in the case of having benzene rings as the ring structures, the crosslinking agent (D) may have a biphenyl structure, a benzophenone structure, a diphenyl ether structure, or the like.

The crosslinking agent (D) preferably contains a fluorine atom within the molecule, more preferably contains from one to six fluorine atoms within the molecule, and still more preferably contains from three to six fluorine atoms within the molecule. For example, the crosslinking agent (D) may contain a fluoroalkyl group within the molecule. Specifically, the crosslinking agent (D) may contain a trifluoroalkyl group or a hexafluoroisopropyl group.

Examples of the crosslinking agent (D) include: carboxylic acid compounds such as alicyclic carboxylic acids, benzene carboxylic acids, naphthalene carboxylic acids, diphthalic acids, and fluorinated aromatic ring carboxylic acids; and carboxylic acid ester compounds such as alicyclic carboxylic acid esters, benzene carboxylic acid esters, naphthalene carboxylic acid esters, diphthalic acid esters, and fluorinated aromatic ring carboxylic acid esters. The carboxylic acid ester compound is a compound containing a carboxy group (—C(=O)OH group) within the molecule, and is a compound in which at least one X, in the three or more —C(=O)OX groups contained therein, is an alkyl group having from 1 to 6 carbon atoms (namely, a compound containing an ester bond).

In the composition for forming a metal-containing film according to the present disclosure, in a case in which the crosslinking agent (D) is the carboxylic acid ester compound, aggregation due to the association between the compound (A) and the crosslinking agent (D) in the composition is prevented, thereby reducing agglomerates and pits. At the same time, it becomes easy to obtain a film having a higher smoothness or a film having a larger film thickness, and to control the film thickness of the resulting film.

The carboxylic acid compound is preferably a quadrivalent or lower valent carboxylic acid compound containing four or less -C(=O)OH groups, and more preferably a trivalent or quadrivalent carboxylic acid compound containing three or four-C(=O)OH groups.

The carboxylic acid ester compound is preferably a compound containing three or less carboxy groups (—C(=O)OH groups) and three or less ester bonds within the molecule, and more preferably a compound containing two or less carboxy groups and two or less ester bonds within the molecule.

Further, in a case in which each X in the three or more —C(=O)OX groups, in the carboxylic acid ester compound, is an alkyl group having from 1 to 6 carbon atoms, each X is preferably a methyl group, an ethyl group, a propyl group, or a butyl group. However, each X is preferably an ethyl group or a propyl group, from the viewpoint of further preventing the aggregation due to the association between the compound (A) and the crosslinking agent (D) in the composition.

Specific examples of the carboxylic acid compound include, but are not limited to: alicyclic carboxylic acids such as 1,2,3,4-cyclobutanetetracarboxylic acid, 1,2,3,4-cyclopentanetetracarboxylic acid, 1,3,5-cyclohexanetricarboxylic acid, 1,2,4-cyclohexanetricarboxylic acid, 1,2,4,5-cyclohexanetetracarboxylic acid, and 1,2,3,4,5,6-cyclohexanehexacarboxylic acid; benzenecarboxylic acids such as 1,2,4-benzenetricarboxylic acid, 1,3,5-benzenetricarboxylic acid, pyromellitic acid, benzenepenta carboxylic acid, and mellitic acid; naphthalenecarboxylic acids such as 1,4,5,8-naphthalenetetracarboxylic acid, and 2,3,6,7-naphthalenetetracarboxylic acid; diphthalic acids such as 3,3',5, 5'-tetracarboxydiphenylmethane, biphenyl-3,3',5,5'-tetracarboxylic acid, biphenyl-3,4',5-tricarboxylic acid, biphenyl-3, 3',4,4'-tetracarboxylic acid, benzophenone-3,3',4,4'-tetracarboxylic acid, 4,4'-oxydiphthalic acid, and 1,3-bis (phthalic acid)tetramethyldisiloxane; and fluorinated aromatic ring carboxylic acids such as 4,4'-(hexafluoroisopropylidene)diphthalic acid, 9,9-bis(trifluoromethyl)-9H-xanthen-2,3,6,7-tetracarboxylic acid, and 1,4-ditrifluoromethylpyromellitic acid.

Specific examples of the carboxylic acid ester compound include a compound obtained by substituting at least one carboxy group in any of the compounds described above as the specific examples of the carboxylic acid compound, with an ester group. The carboxylic acid ester compound may be, for example, a half-esterified compound represented by any of the following Formulae (D-1) to (D-6).

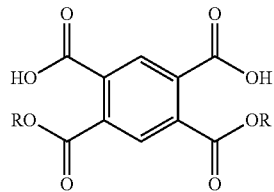
(D-1)

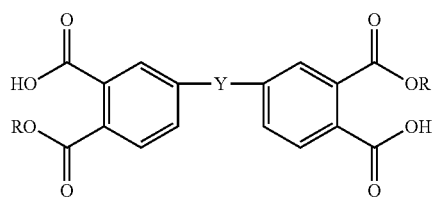
Y = O, C = O, C(CF$_3$)$_2$
(D-2)

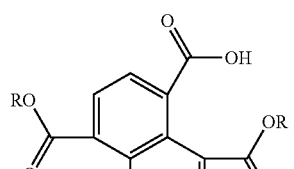
(D-3)

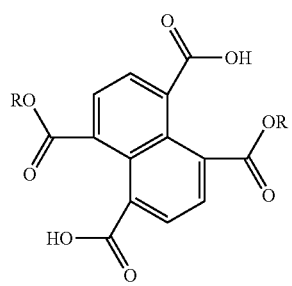
(D-4)

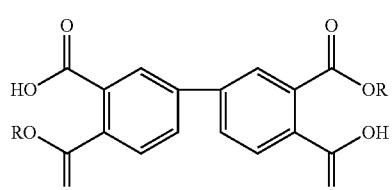
(D-5)

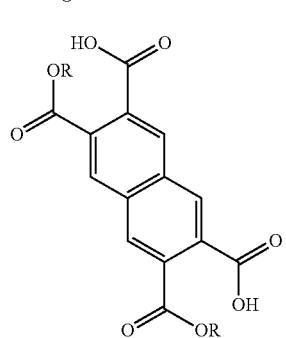
(D-6)

Each R in Formulae (D-1) to (D-6) represents an alkyl group having from 1 to 6 carbon atoms. In particular, each R is preferably a methyl group, an ethyl group, a propyl group, or a butyl group, and more preferably an ethyl group or a propyl group.

The half-esterified compound can be produced, for example, by mixing a carboxylic anhydride which is an anhydride of the above described carboxylic acid compound with an alcohol solvent, to cause a ring-opening reaction of the carboxylic anhydride to occur.

In the present disclosure, the content of the crosslinking agent (D) in the composition for forming a metal-containing film is not particularly limited. For example, the ratio (COOH/N) of the sum of the number of carboxy groups in the compound (B) and the number of carboxy groups in the crosslinking agent (D), with respect to the total number of nitrogen atoms in the compound (A), is preferably from 0.1 to 3.0, more preferably from 0.3 to 2.5, and still more preferably from 0.4 to 2.2. When the ratio COOH/N is from 0.1 to 3.0, the use of the composition for forming a metal-containing film allows for producing a film which has a crosslinked structure, such as an amide or imide structure, between the compound (A) and the crosslinking agent (D) after being subjected to a heat treatment, and which has a more excellent heat resistance and insulation properties.

(Other Components)

In the composition for forming a metal-containing film according to the present disclosure, each of the content of sodium and the content of potassium is preferably 10 ppb by mass or less on an elemental basis. When each of the content of sodium and the content of potassium is 10 ppb by mass or less on an elemental basis, it is possible to prevent the occurrence of inconvenience in electrical properties of a semiconductor device, such as malfunction of a transistor.

The composition for forming a metal-containing film according to the present disclosure may contain water or a solvent other than water (such as a water-soluble solvent). Examples thereof include: alcohols such as methanol, ethanol, 1-propanol, isopropanol, and butyl alcohol; ethylene glycol; dimethoxyethane; dioxane; acetone; acetonitrile; cyclopentanone; tetrahydrofuran; and normal hexane.

In a case in which the composition for forming a metal-containing film according to the present disclosure contains a silane coupling agent containing an amino group (for example, an alkoxysilane, such as 3-aminopropyltriethoxysilane) as the compound (A-2), the composition may contain an inorganic acid such as hydrochloric acid or nitric acid, for the hydrolysis of alkoxy groups.

Further, the composition for forming a metal-containing film according to the present disclosure may contain phthalic acid, benzoic acid or the like, or a derivative thereof, in order to improve the electrical properties, for example.

Still further, the composition for forming a metal-containing film according to the present disclosure may contain benzotriazole or a derivative thereof, in order to prevent corrosion of copper, for example.

The composition for forming a metal-containing film according to the present disclosure preferably has a pH of from 2.0 to 12.0, but not particularly limited thereto.

[Method of Producing Composition for Forming Metal-Containing Film]

A method of producing the composition for forming a metal-containing film according to one embodiment of the present disclosure will be described below. The method of producing the composition for forming a metal-containing film according to the present disclosure includes a mixing step of mixing at least the compound (A) and the compound (B).

It is to be noted that any of components other than the compound (A) and compound (B) (such as the additive (C), the crosslinking agent (D), and a water-soluble solvent) may be added to a mixture of the compound (A) and the compound (B), at an arbitrary timing during the production of the composition for forming a metal-containing film. In other words, the timing for adding any of the components other than the compound (A) and compound (B) is not particularly limited.

In a case in which the composition for forming a metal-containing film according to the present disclosure contains both the compound (a1) and the compound (a2) as the compound (A), the mixing step in the present disclosure is preferably a step of mixing at least a mixture of the compound (a2) and the compound (B), with the compound (a1).

In other words, it is preferred that the compound (a2) and the compound (B) are mixed in advance. This allows for suitably preventing clouding and gelation of the composition (the occurrence of gelation may lead to a longer time required for making the composition transparent, and thus is not preferred), when mixing the mixture of the compound (a2) and the compound (B), with the compound (a1).

In a case in which the composition for forming a metal-containing film according to the present disclosure contains the compound (a1) as the compound (A), the mixing step in the present disclosure is preferably a step of mixing at least: a mixture of the additive (C) which is the acid containing a carboxy group and having a weight average molecular weight of from 46 to 195, and the compound (a1); with the compound (B).

In other words, it is preferred that the compound (a1) and the additive (C) are mixed in advance. This allows for suitably preventing the clouding and gelation of the composition (the occurrence of gelation may lead to a longer time required for making the composition transparent, and thus is not preferred), when mixing the mixture of the additive (C) and the compound (a1), with the compound (B).

In a case in which the composition for forming a metal-containing film according to the present disclosure contains both the compound (a1) and the compound (a2) as the compound (A), and further contains the additive (C) which is the acid containing a carboxy group and having a weight average molecular weight of from 46 to 195, the mixing step in the present disclosure is preferably a step of mixing at least the mixture of the compound (a2) and the compound (B), with the mixture of the additive (C) and the compound (a1).

In other words, it is preferred that the compound (a2) and the compound (B) are mixed in advance, and that the additive (C) and the compound (a1) are mixed in advance. This allows for suitably preventing the clouding and gelation of the composition (the occurrence of gelation may lead to a longer time required for making the composition transparent, and thus is not preferred), when mixing the mixture of the compound (a2) and the compound (B), with the mixture of additive (C) and the compound (a1).

<Metal-Containing Film>

The composition for forming a metal-containing film according to the present disclosure is used for forming a metal-containing film.

The metal-containing film may be, for example, at least one layer (such as an upper layer resist film, a lower layer resist film, or an intermediate resist film) of a multilayer resist layer; or an embedded dielectric film (such as a shallow trench isolation film (STI film), a pre-metal dielectric film (PMD film), or an inter-wiring layer dielectric film (such as an IMD film or an ILD film).

Examples of the metal-containing film other than those described above include a metal-containing film (embedded planarization film) obtained by filling a gap fill material into a recessed portion formed in a substrate.

In a case in which at least one layer of a multilayer resist layer is the metal-containing film, the metal-containing film (one layer) preferably has a thickness of, for example, from 5 nm to 900 nm, and preferably from 10 nm to 200 nm. It is preferred that the total thickness of the multilayer resist layer is, for example, from 20 nm to 1,000 nm.

In a case in which the metal-containing film is an embedded dielectric film filled into a recessed portion formed in a substrate, the thickness of the embedded dielectric film (metal-containing film), for example, the depth of the recessed portion, is from 10 nm to 1,000 nm, and preferably from 20 nm to 300 nm. On the surface of the substrate in which the recessed portion has been filled with the embedded dielectric film, a dielectric film may further be formed to a thickness of 500 nm or less, and preferably to a thickness of 200 nm or less.

More specifically, in a case in which the embedded dielectric film is a shallow trench isolation film (STI film), the thickness of the STI film, for example, the depth of the recessed portion, is from 10 nm to 1,000 nm, and preferably from 30 nm to 300 nm. On the surface of the substrate in which the recessed portion has been filled with the embedded dielectric film, a dielectric film may further be formed to a thickness of 500 nm or less, and preferably to a thickness of 200 nm or less.

In a case in which the embedded dielectric film is a pre-metal dielectric film (PMD film), the thickness of the PMD film, for example, the depth of the recessed portion, is from 10 nm to 500 nm, and preferably from 20 nm to 300 nm. On the surface of the substrate in which the recessed portion has been filled with the embedded dielectric film, a dielectric film may further be formed to a thickness of 500 nm or less, and preferably to a thickness of 200 nm or less.

In a case in which the embedded dielectric film is an inter-wiring layer dielectric film (such as an 1 MB film or an ILD film), the thickness of the 1 MB film or the ILD film, for example, the depth of the recessed portion, is from 30 nm to 400 nm, and preferably from 50 nm to 300 nm. On the surface of the substrate in which the recessed portion has been filled with the embedded dielectric film, a dielectric film may further be formed to a thickness of 500 nm or less, and preferably to a thickness of 300 nm or less.

It is preferred that such an embedded dielectric film is formed using a technique (shallow trench isolation) in which the embedded dielectric film is provided in a trench of a silicon substrate to form an element isolation region.

Further, in the case of forming an embedded dielectric film in a recessed portion having a narrow width, namely, a trench having a large aspect ratio (depth/width), it is preferred to apply (preferably, by a spin coating method) the composition for forming a metal-containing film according to the present disclosure into the recessed portion to form the embedded dielectric film, from the viewpoint of enhancing the filling properties into the trench.

In a case in which the metal-containing film is an embedded planarization film filled into a recessed portion formed in a substrate, the thickness of the embedded planarization film, for example, the depth of the recessed portion, is from 10 nm to 1,000 nm, and preferably from 20 nm to 300 nm. On the surface of the substrate in which the recessed portion has been filled with the embedded dielectric film, a planarization film may further be formed to a thickness of 500 nm or less, and preferably to a thickness of 200 nm or less.

In the case of forming a copper multilayer wiring by a dual damascene process, the above described metal-containing film can be used as a metal-containing film which is an embedded planarization film formed in a via, for example, in a via first process.

Further, in the case of forming an embedded planarization film in a recessed portion having a narrow width, namely, a trench having a large aspect ratio (depth/width), it is preferred to apply (preferably, by a spin coating method) the composition for forming a metal-containing film according to the present disclosure into the recessed portion to form the embedded planarization film, from the viewpoint of enhancing the filling properties into the trench.

In particular, the composition for forming a metal-containing film according to the present disclosure is suitably used for forming a metal-containing film in a multilayer resist layer including the metal-containing film, from the viewpoint of obtaining a multilayer resist layer having an improved etching selectivity in order to allow for the formation of a fine pattern, and obtaining a multilayer resist layer having an improved heat resistance.

This arrangement allows for obtaining a multilayer resist layer having further improved etching selectivity and heat resistance. In addition, the arrangement facilitates obtaining a multilayer resist layer having excellent filling properties into a recessed portion as well.

Further, the composition for forming a metal-containing film according to the present disclosure can be used for forming at least one layer (such as an upper layer resist film, a lower layer resist film, or an intermediate resist film) included in a multilayer resist layer. In other words, the composition for forming a metal-containing film according to the present disclosure is contained in at least one layer in the multilayer resist layer.

The composition for forming a metal-containing film according to the present disclosure may be used as a material to be embedded into a recessed portion formed in at least one layer of a multilayer resist layer.

The composition for forming a metal-containing film according to the present disclosure is suitably used for forming a metal-containing film which is an embedded dielectric film, in a semiconductor device including the metal-containing film, from the viewpoint of obtaining a metal-containing film having further improved etching selectivity and heat resistance.

This arrangement allows for obtaining a semiconductor device including an embedded dielectric film (such as an STI film, a PMD film, an IMD film, or an ILD film) having further improved etching selectivity and heat resistance.

In particular, in a case in which the composition for forming a metal-containing film according to the present disclosure is used for forming a resist pattern in a multilayer resist process, or an embedded dielectric film (such as an STI film, a PMD film, an IMD film, or an ILD film), a metal-containing film having excellent filling properties into a recessed portion as well, in addition to having excellent etching selectivity and heat resistance, can be easily obtained.

[Method of Forming Metal-Containing Film]

A method of forming a metal-containing film in the present disclosure includes, for example, an application step of applying the composition for forming a metal-containing film to a substrate, and a heating step of heating the substrate to which the composition for forming a metal-containing film has been applied.

<Application Step>

The application step is a step of applying the composition for forming a metal-containing film to a substrate. The substrate may be, for example, a semiconductor substrate such as a silicon substrate (or a semiconductor device), a circuit board (such as a printed wiring board), a glass substrate, a quartz substrate, a stainless steel substrate, a plastic substrate or the like. The shape of the substrate is not particularly limited, and the substrate may have any shape, such as a plate-like or dish-like shape. For example, the silicon substrate may be a silicon substrate provided with an inter-layer dielectric layer (Low-k film), or a silicon substrate in which a microtrench (recessed portion), a micro through hole, or the like is formed.

The method of applying the composition for forming a metal-containing film is not particularly limited, and an ordinary method can be used.

Examples of the ordinary method include a dipping method, a spray method, a spin coating method, and a bar coating method. For example, in the case of forming a film having a nano-sized film thickness (of from several nm to several hundreds nm), it is preferred to use a spin coating method.

For example, the method of applying the composition for forming a metal-containing film by a spin coating method is not particularly limited. It is possible to use, for example, a method in which the composition for forming a metal-containing film is dropped on the surface of a substrate while rotating the substrate on a spin coater, and then the number of revolutions for rotating the substrate is increased to carry out drying.

In the method of applying the composition for forming a metal-containing film by a spin coating method, various conditions, such as the number of revolutions for rotating the substrate, the amount to be dropped and dropping time of the composition for forming a metal-containing film, and the number of revolutions for rotating the substrate during the drying, are not particularly limited. The conditions can be adjusted as appropriate, taking into consideration the thickness of the film to be formed, and the like.

<Drying Step>

The method of forming a metal-containing film may include, before the heating step to be described later, a drying step of drying the substrate to which the composition for forming a metal-containing film has been applied, under the condition of a temperature of from 80° C. to 150° C. It is to be noted that the above described temperature refers to the temperature of the surface of the substrate on which the composition for forming a metal-containing film has been applied.

The temperature is preferably from 90° C. to 140° C., and more preferably from 100° C. to 130° C.

The drying in the present step can be carried out by an ordinary method. For example, the drying can be carried out using a hot plate.

The atmosphere under which the drying in the present step is carried out is not particularly limited. The drying may be carried out, for example, under an air atmosphere, or under the atmosphere of an inert gas (such as nitrogen gas, argon gas, or helium gas).

Further, from the viewpoint of improving the filling properties (embeddability) into a microtrench, the drying may be carried out under reduced pressure so that air bubbles in the film can be removed.

The drying is carried out for a drying time of preferably 300 seconds or less, more preferably 200 seconds or less, still more preferably 120 seconds or less, and particularly preferably 80 seconds or less, but not particularly limited thereto.

The lower limit of the drying time can be set, for example, to 10 seconds (preferably 20 seconds, and more preferably 30 seconds), but not particularly limited thereto.

<Washing Step>

The method of forming a metal-containing film may include, before the heating step to be described later, a washing step of washing the substrate to which the composition for forming a metal-containing film has been applied, with water or the like, in order to remove the composition for forming a metal-containing film excessively applied to the substrate. When the production method according to the present disclosure includes the above described drying step, it is preferred that the washing step is carried out after the drying step.

<Heating Step>

The method of forming a metal-containing film in the present disclosure further includes a heating step of heating the substrate to which the composition for forming a metal-containing film has been applied, for example, at a temperature of from 200° C. to 425° C.

It is to be noted that the above described temperature refers to the temperature of the surface of the substrate on which the composition for forming a metal-containing film has been applied.

When the method of forming a metal-containing film includes the heating step described above, the cationic functional group contained in the compound (A) and containing at least one of a primary nitrogen atom or a secondary nitrogen atom, reacts with the —C(=O)O— group(s) contained in the compound (B) to form at least one of an amide bond, an imide bond, or an amide-imide bond. In other words, a crosslinked structure is formed between the compound (A) and the compound (B), in the resulting metal-containing film.

The temperature is preferably from 250 C to 400° C., and more preferably from 300° C. to 400° C.

The pressure at which the heating in the heating step is carried out is not particularly limited. However, the heating is preferably carried out at an absolute pressure of from more than 17 Pa to atmospheric pressure.

The absolute pressure is more preferably from 1,000 Pa to atmospheric pressure, still more preferably from 5,000 Pa to atmospheric pressure, and particularly preferably from 10,000 Pa to atmospheric pressure.

The heating in the heating step can be carried out by an ordinary method using a furnace or a hot plate. The furnace to be used may be, for example, SPX-1120 manufactured by APEX Co., Ltd., or VF-1000 LP manufactured by Koyo Thermo Systems Co., Ltd.

Further, the heating in the present step may be carried out under an air atmosphere, or under the atmosphere of an inert gas (such as nitrogen gas, argon gas, or helium gas).

The heating in the heating step is carried out for a heating time of, for example, one hour or less, preferably 30 minutes or less, more preferably 10 minutes or less, and particularly preferably 5 minutes or less, but not particularly limited thereto. The lower limit of the heating time can be set, for example, to 0.1 minutes, but not particularly limited thereto.

In order to shorten the time required for carrying out the heating step, UV light may be irradiated on the surface of the substrate on which the composition for forming a metal-containing film has been applied. The UV light is preferably a UV light having a wavelength of from 170 nm to 230 nm, an excimer light having a wavelength of 222 nm, an excimer light having a wavelength of 172 nm, or the like. Further, it is preferred to carry out the irradiation of UV light under an inert gas atmosphere.

[Semiconductor Device]

A semiconductor device according to the present disclosure will now be described below.

The semiconductor device according to the present disclosure is a semiconductor device including a metal-containing film which is an embedded dielectric film, wherein the metal-containing film preferably includes the composition for forming a metal-containing film according to the present disclosure.

The semiconductor device according to the present disclosure includes a metal-containing film which is an embedded dielectric film (such as an STI film, a PMD film, an 1 MB film, or an ILD film) having an excellent etching selectivity as well as an excellent heat resistance.

Further, the embedded dielectric film tends to have excellent filling properties into a recessed portion.

[Method of Producing Semiconductor Device]

A method of producing the semiconductor device according to the present disclosure is a method of producing a semiconductor device including a metal-containing film which is an embedded dielectric film, and the method includes a step of forming the embedded dielectric film using the composition for forming a metal-containing film according to the present disclosure.

The method of producing the semiconductor device according to the present disclosure allows for the production of a semiconductor device including an embedded dielectric film (such as an STI film, a PMD film, an IMD film, or an ILD film) having an excellent etching selectivity as well as an excellent heat resistance. Further, the method facilitates obtaining an embedded dielectric film having excellent filling properties into a recessed portion.

The step of forming an embedded dielectric film includes, for example, an application step of applying the composition for forming a metal-containing film on a substrate on which an embedded dielectric film is to be formed, and a heating step of heating the substrate to which the composition for forming a metal-containing film has been applied.

Descriptions regarding the respective steps (such as the application step, a drying step, a washing step, and the heating step) in the step of forming an embedded dielectric film are omitted, since these steps are the same as the respective steps in the method of forming a metal-containing film described above.

The method of producing the semiconductor device according to the present disclosure may include other steps.

Examples of other steps include known steps in a semiconductor process.

For example, the method of producing the semiconductor device according to the present disclosure may include a plasma step as one of the other steps.

Examples of the plasma to be used in the plasma step include a plasma generated from at least one type of gas selected from the group consisting of helium gas, argon gas, nitrogen gas, ammonia gas, and a fluorocarbon gas.

In a case in which the method of producing the semiconductor device according to the present disclosure includes the plasma step, the resulting embedded dielectric film (such as an STI film, a PMD film, an IMD film, or an ILD film) tends to have an excellent plasma resistance even when exposed to the plasma.

In a case in which the method of producing the semiconductor device according to the present disclosure includes the heating step, the resulting embedded dielectric film has an excellent heat resistance.

Further, the method of producing the semiconductor device according to the present disclosure may include a removal step of removing the resulting embedded dielectric film (such as an STI film, a PMD film, an IMD film, or an ILD film), as one of the other steps. This embodiment is particularly suitable in a case in which at least one resulting embedded dielectric film is a sacrificial film.

Examples of the method of removing the resulting embedded dielectric film in the removal step include the above described UV ozone treatment, or a plasma treatment as a removal treatment.

The embedded dielectric film may be retained to be used as a dielectric film.

EXAMPLES

The present disclosure will now be specifically described by way of Examples. However, the present disclosure is in no way limited to these Examples.

In the description given below, ultrapure water (MILLI-Q WATER, manufactured by Millipore Corporation, resistance: 18 MΩ·cm (25° C.) or less) was used as "water".

Preparation of Composition for Forming Metal-Containing Film

Example 1

3-Aminopropyldiethoxymethylsilane (3APDES) (371890 (product number), manufactured by Sigma-Aldrich Co. LLC.) was prepared. To the thus prepared 3-aminopropyldiethoxymethylsilane (3APDES), 1-propanol was added, and then an aqueous solution of formic acid was added to the resultant for the control of pH and the hydrolysis of the 3APDES. The resulting mixture was stirred at room temperature for one hour, followed by heating in a water bath controlled to 60° C. for one hour, to obtain a 3APDES-containing solution (1).

Separately, an aqueous ammonium salt solution was added to carboxyethylgermanium sesquioxide (BCGe) (B1367 (product number), manufactured by Tokyo Chemical Industry Co., Ltd.), to obtain a BCGe-containing solution.

Subsequently, the BCGe-containing solution was added to the 3APDES-containing solution (1), to obtain a composition for forming a metal-containing film (hereinafter, also referred to as the "composition") of Example 1.

It is to be noted that the 3-aminopropyldiethoxymethylsilane (3APDES) is an example of the compound (A-2) in the compound (a1).

The formic acid in the aqueous solution of formic acid is an example of the additive (C).

The carboxyethylgermanium sesquioxide (BCGe) is an example of the compound (b1) in the compound (B), and specifically, is an example compound (b1-21).

The ammonia in the aqueous ammonium salt solution is an example of the base (A-4) in the compound (a2).

Example 2

The same 3-aminopropyldiethoxymethylsilane (3APDES) as one used in Example 1 was prepared. The thus prepared 3-aminopropyldiethoxymethylsilane (3APDES) was dissolved in water to prepare a 50% 3APDES solution. The resulting solution was then heated in a water bath controlled to 75° C. for 5 minutes, and left to stand overnight, to obtain a 3APDES-containing solution (2).

Subsequently, a BCGe-containing solution obtained in the same manner as in Example 1 was added to the 3APDES-containing solution (2), to obtain a composition for forming a metal-containing film of Example 2.

Example 3

Polyallylamine (PAH) (24826 (product number), weight average molecular weight: 15,000, manufactured by Polysciences, Inc.) was prepared. The thus prepared polyallylamine (PAH) was dissolved in water, to obtain a 2.74% PAH-containing solution.

A BCGe-containing solution obtained in the same manner as in Example 1 was added to the PAH-containing solution, to obtain a composition for forming a metal-containing film of Example 3.

The polyallylamine (PAH) is an example of the compound (A-1) in the compound (a1).

Example 4

As branched polyethyleneimine, polyethyleneimine (BPEI; branched polyethyleneimine, Mw=70,000, the ratio of primary nitrogen atoms/secondary nitrogen atoms/tertiary nitrogen atoms=31/40/29; manufactured by BASF Japan Ltd.) was prepared. The thus prepared branched polyethyleneimine (BPEI) was dissolved in water, to obtain a 3.6% BPEI-containing solution.

Subsequently, a BCGe-containing solution obtained in the same manner as in Example 1 was added to the BPEI-containing solution, to obtain a composition for forming a metal-containing film of Example 4.

The branched polyethyleneimine is an example of the compound (A-1) in the compound (a1).

Example 5

An aqueous ammonia solution was added to carboxyethylgermanium sesquioxide (BCGe) (B1367 (product number), manufactured by Tokyo Chemical Industry Co., Ltd.), to obtain an aqueous ammonium salt solution of BCGe (18.21%). The thus obtained aqueous ammonium salt solution of BCGe (18.21%) was used as a composition for forming a metal-containing film of Example 5.

Example 6

Paraxylene diamine (pXDA) was prepared. To the thus prepared paraxylene diamine (pXDA), 1-propanol was added to obtain a pXDA-containing solution.

A BCGe-containing solution obtained in the same manner as in Example 1 was added to the resulting pXDA-containing solution, to obtain a composition for forming a metal-containing film of Example 6.

The paraxylene diamine (pXDA) is an example of the compound (A-3) in the compound (a1).

Example 7

Ethylamine (EA) was added to carboxyethylgermanium sesquioxide (BCGe) (B1367 (product number), manufactured by Tokyo Chemical Industry Co., Ltd.), to obtain a BCGe-containing EA solution.

A pXDA-containing solution obtained in the same manner as in Example 6 was added to the resulting EA solution, to obtain a composition for forming a metal-containing film of Example 7.

Example 8

An aqueous ammonium salt solution, and trimellitic acid (124BTC) as the crosslinking agent (D), were added to carboxyethylgermanium sesquioxide (BCGe) (B1367 (product number), manufactured by Tokyo Chemical Industry Co., Ltd.), to obtain a mixed solution (1).

A BPEI-containing solution obtained in the same manner as in Example 4 was added to the resulting mixed solution (1), to obtain a composition for forming a metal-containing film of Example 8.

Example 9

The same polyethyleneimine (BPEI) as one used in Example 4 and the same paraxylene diamine (pXDA) as one used in Example 6 were mixed with 1-propanol, to obtain a mixed solution (2).

A BCGe-containing solution obtained in the same manner as in Example 1 was added to the resulting mixed solution (2), to obtain a composition for forming a metal-containing film of Example 9.

Example 10

A BCGe-containing EA solution was obtained in the same manner as in Example 7.

Paraxylene diamine (pXDA), and trimellitic acid (135BTC) as the crosslinking agent (D), were mixed with 1-propanol to obtain a mixed solution (3).

The EA solution and the mixed solution (3) were mixed, to obtain a composition for forming a metal-containing film of Example 10.

Example 11

A composition for forming a metal-containing film of Example 11 was obtained in the same manner as in Example 10, except that trimesic acid (124BTC) was used as the crosslinking agent (D).

Comparative Example 1

The same branched polyethyleneimine (BPEI) as one used in Example 4 was prepared, to obtain a BPEI-containing solution which is the same as that obtained in Example 4.

An ethyl half ester of pyromellitic acid (ehePMA) was mixed with the BPEI-containing solution (1% by mass with respect to the total amount of the composition) such that the ratio COOH/N (the ratio of the number of carboxy groups in the ethyl half ester of pyromellitic acid (ehePMA) with respect to the number of nitrogen atoms in the BPEI) was 0.71. Further, ethanol (EtOH) was mixed with the resultant such that the concentration of ethanol with respect to the total amount of the composition was 37.44% by mass, to obtain a composition of Comparative Example 1. The composition of Comparative Example 1 is a composition for forming an organic film.

The ethyl half ester of pyromellitic acid (ehePMA) was prepared by adding pyromellitic dianhydride to ethanol, and then heating the mixture in water bath heated to 50° C. for 3 hours and 30 minutes, to completely dissolve the powder of pyromellitic dianhydride. The formation of ester groups in the thus produced ehePMA was confirmed by proton NMR.

The ethyl half ester of pyromellitic acid (ehePMA) is an example of the crosslinking agent (D).

Comparative Example 2

An aqueous ethanol solution (6.4% by mass) of the above described ethyl half ester of pyromellitic acid (ehePMA) was added to the 3APDES-containing solution (1) obtained in the same manner as in Example 1, to obtain a composition of Comparative Example 2. The composition of Comparative Example 2 is a composition for forming a silicon-containing film.

Comparative Example 3

A composition of Comparative Example 3 was obtained in the same manner as in Example 1, except that the BCGe-containing solution was not added to the 3APDES-containing solution (1) in the preparation of the composition for forming a metal-containing film in Example 1. In other words, the composition of Comparative Example 3 is the 3APDES-containing solution (1).

The composition and the pH of each of the compositions obtained in the Examples and Comparative Examples are as shown in Table 1.

TABLE 1

| | Compound (A) | | | | Compound (B) | | Additive (C) | | Crosslinking agent (D) | | Solvent(s) other than water | | |
|---|---|---|---|---|---|---|---|---|---|---|---|---|---|
| | Type (a1) | Concentration (% by mass) | Type (a2) | Concentration (% by mass) | Type | Concentration (% by mass) | Type | Concentration (% by mass) | Type | Concentration (% by mass) | Type | Concentration (% by mass) | PH |
| Example 1 | 3APDES (A-2) | 4.00% | $NH_3$ (A-4) | 1.02% | BCGe (b1) | 3.58% | Formic acid | 1.76% | — | — | 1PrOH | 80.00% | |
| Example 2 | 3APDES (A-2) | 3.00% | $NH_3$ (A-4) | 1.35% | BCGe (b1) | 2.66% | — | | — | — | — | 0.00% | |
| Example 3 | PAH (A-1) | 1.80% | $NH_3$ (A-4) | 2.73% | BCGe (b1) | 5.36% | — | | — | — | — | 0.00% | |
| Example 4 | BPEI (A-1) | 2.00% | $NH_3$ (A-4) | 3.99% | BCGe (b1) | 7.84% | — | | — | — | — | 0.00% | |
| Example 5 | None | — | $NH_3$ (A-4) | 1.57% | BCGe (b1) | 18.21% | — | | — | — | — | 0.00% | |

TABLE 1-continued

| | Compound (A) | | | | Compound (B) | | Additive (C) | | Crosslinking agent (D) | | Solvent(s) other than water | | |
|---|---|---|---|---|---|---|---|---|---|---|---|---|---|
| | Type (a1) | Concentration (% by mass) | Type (a2) | Concentration (% by mass) | Type | Concentration (% by mass) | Type | Concentration (% by mass) | Type | Concentration (% by mass) | Type | Concentration (% by mass) | PH |
| Example 6 | pXDA (A-3) | 3.00% | $NH_3$ (A-4) | 0.64% | BCGe (b1) | 7.42% | — | — | — | — | 1PrOH | 12.02% | |
| Example 7 | pXDA (A-3) | 4.00% | EA (A-4) | 1.15% | BCGe (b1) | 5.47% | — | — | — | — | 1PrOH | 16.00% | |
| Example 8 | BPEI (A-1) | 2.00% | $NH_3$ (A-4) | 0.97% | BCGe (b1) | 6.29% | — | — | 124BTC | 0.98% | — | — | |
| Example 9 | BPEI (A-1), pXDA (A-3) | 1.42%/ 1.40% | $NH_3$ (A-4) | 0.78% | BCGe (b1) | 9.09% | — | — | — | — | 1PrOH | 5.60% | |
| Example 10 | pXDA (A-3) | 3.00% | EA (A-4) | 1.01% | BCGe (b1) | 5.24% | — | — | 135BTC | 0.94% | 1PrOH | 11.90% | |
| Example 11 | pXDA (A-3) | 3.00% | EA (A-4) | 1.08% | BCGe (b1) | 5.24% | — | — | 124BTC | 1.36% | 1PrOH | 11.70% | |
| Comparative Example 1 | BPEI (A-1) | 1.00% | — | — | — | — | — | — | ehePMA | 2.56% | EtOH | 37.44% | 4.07 |
| Comparative Example 2 | 3APDES (A-2) | 3.40% | — | — | — | — | Formic acid | 1.50% | ehePMA | 1.92% | 1PrOH, EtOH | 30.00% | |
| Comparative Example 3 | 3APDES (A-2) | 4.00% | — | — | — | — | Formic acid | 1.76% | — | — | 1PrOH | 76.00% | |

—Description of Table 1—

In Table 1, the description "Concentration (% by mass)" indicates the concentration of each of the components (the compound (A), the compound (B), the additive (C), the crosslinking agent (D), water and the solvent(s) other than water) in the composition.

In Table 1, the description "1-PrOH" indicates "1-propanol" and the description "EtOH" indicates "ethanol".

A blank cell in Table 1 indicates that the measurement was not carried out.

<Formation of Metal-Containing Film>

A metal-containing film was prepared according to the following method, using each of the compositions for forming a metal-containing film prepared in Examples 1 to 9.

A silicon substrate was prepared as a substrate to be coated with each of the compositions for forming a metal-containing film. The silicon substrate was placed on a spin coater, and 1.0 mL of each of the compositions prepared in respective Examples and Comparative Examples was dropped on the substrate for 10 seconds at a constant rate. After being maintained for 13 seconds, the substrate was rotated at 2,000 rpm (rpm represents a rotational velocity) for one second, at 600 rpm for 30 seconds, and then at 2,000 rpm for 10 seconds, to carry out drying. In this manner, a metal-containing film was formed on the silicon substrate.

After drying at 100° C. for one minute, the metal-containing film was heated under a nitrogen atmosphere (30 kPa) at 300° C. for 10 minutes. The metal-containing film was further heated at 400° C. for 10 minutes (the same sample was treated continuously), in order to carry out an evaluation of the etching selectivity.

When the metal-containing film (the metal-containing film after being subjected to the above described heating at 400° C. for 10 minutes) obtained using the composition for forming a metal-containing film of Example 1, was measured by FT-IR, the formation of amide bonds was confirmed in the metal-containing film of Example 1.

Further, an organic film was prepared using the composition obtained in Comparative Example 1, and a silicon-containing film was prepared using the composition obtained in Comparative Example 2, in the same manner as described above.

<Evaluation 1 of Etching Selectivity>

Each of the metal-containing films of Examples 1 to 9, prepared on a silicon substrate according to the above described method, was placed in a chamber. The interior of the chamber was vacuum drawn to $5\times10^{-6}$ Torr ($6.7\times10^{-4}$ Pa), and oxygen was then allowed to flow into the chamber at 50 sccm (about $8.3\times10^{-7}$ m$^3$/s) to control the pressure within the chamber to 0.15 Torr (20 Pa), followed by irradiation of oxygen plasma ($O_2$ plasma) at 100 W.

The evaluation 1 of the etching selectivity was carried out by measuring the amount of decrease of the metal-containing film and the etching rate due to $O_2$ plasma irradiation.

The amount of decrease of the metal-containing film due to $O_2$ plasma irradiation was calculated by subtracting the film thickness of the metal-containing film after being subjected to the $O_2$ plasma irradiation for a predetermined period of time, from the film thickness of the metal-containing film after being subjected to the above described heating at 400° C. for 10 minutes. The results are shown in Table 2.

Further, the etching rate due to $O_2$ plasma irradiation was calculated by obtaining the amount of decrease of the metal-containing film (nm), and then dividing the amount of decrease (nm) by irradiation time of $O_2$ plasma (5 minutes in the case of the evaluation 1). The results are shown in Table 2.

The evaluation 1 of the etching selectivity was also carried out for the organic film of Comparative Example 1 and the silicon-containing film of Comparative Example 2, in the same manner as described above. The results are shown in Table 2.

TABLE 2

| Oxygen plasma irradiation time (minutes) | Example 1: 3APDES + BCGe + NH$_3$ + formic | Example 2: 3APDES + BCGe + NH$_3$ | Example 3: PAH + BCGe + NH$_3$ | Example 4: BPEI + BCGe + NH$_3$ | Example 5: BCGe + NH$_3$ | Example 6: pXDA + BCGe + NH$_3$ |
|---|---|---|---|---|---|---|
| 0 | | | | | | |
| 1 | 6.2 nm | 5.6 nm | 3.2 nm | 0.4 nm | 4.4 nm | 2.0 nm |
| 3 | 5.6 nm | 7.5 nm | | | | |
| 5 | 7.5 nm | 8.3 nm | 4.0 nm | 0.0 nm | 4.1 nm | 3.2 nm |
| 7 | 7.7 nm | | | | | |
| 15 | | | | | | |
| 17 | 8.0 nm | | 2.9 nm | 2.5 nm | 7.3 nm | |
| Initial film thickness (nm) | 193.9 nm | 112.4 nm | 101.7 nm | 153.8 nm | 253.3 nm | 206.3 nm |
| O$_2$ plasma etching rate (nm/min) | 1.50 | 1.66 | 0.80 | 0.00 | 0.82 | 0.64 |
| Si content (elemental ratio) | 5.1 | 5.1 | 0.0 | 0.0 | 0.0 | 0.0 |
| Ge content (elemental ratio) | 5.1 | 5.1 | 9.5 | 10.5 | 15.4 | 8.7 |

| Oxygen plasma irradiation time (minutes) | Example 7: pXDA + BCGe + EA | Example 8: BPEI + BCGe + 124BTC + NH$_3$ | Example 9: BPEI + pXDA + BCGe + NH$_3$ | Comparative Example 1: BPEI + ehePMA | Comparative Example 2: 3APDES + ehePMA + formic |
|---|---|---|---|---|---|
| 0 | | | | | |
| 1 | 1.4 nm | 2.4 nm | 0.0 nm | 6.9 nm | 6.2 nm |
| 3 | | | | 25.0 nm | 8.7 nm |
| 5 | 3.4 nm | 3.8 nm | 0.0 nm | 34.9 nm | 10.9 nm |
| 7 | | | | | 11.4 nm |
| 15 | | | | 51.5 nm | |
| 17 | | | | | 14.2 nm |
| Initial film thickness (nm) | 198.9 nm | 136.9 nm | 202.2 nm | 55.3 nm | 136.5 nm |
| O$_2$ plasma etching rate (nm/min) | 0.68 | 0.76 | 0.00 | 6.98 | 2.18 |
| Si content (elemental ratio) | 0.0 | 0.0 | 0.0 | 0.0 | 5.0 |
| Ge content (elemental ratio) | 6.4 | 10.7 | 11.4 | 0.0 | 0.0 |

—Description of Table 2—

In Table 2, the description "formic" indicates "formic acid". The same applies for Table 4 to Table 6 to be described later. Further, the description "Initial film thickness (nm)" indicates the film thickness of the metal-containing film (the organic film in the case of Comparative Example 1, and the silicon-containing film in the case of Comparative Example 2) after being subjected to the heating at 400° C. for 10 minutes.

In Table 2, the description "Si content (elemental ratio)" indicates the ratio of the number of atoms of Si element with respect to the number of atoms of total elements, which is taken as 100, in the composition, calculated from charged amounts.

In Table 2, the description "Ge content (elemental ratio)" indicates the ratio of the number of atoms of Ge element with respect to the number of atoms of total elements, which is taken as 100, in the composition, calculated from the charged amounts.

As shown in Table 2, the metal-containing films obtained using the compositions of Examples 1 to 9 which contained the compound (A) and the compound (B) showed a smaller amount of decrease of the film (namely, had a smaller O$_2$ plasma etching rate), as compared to the organic film obtained using the composition of Comparative Example 1 which contained the compound (A) but did not contain the compound (B).

Further, the metal-containing films obtained using the compositions of Examples 1 to 9 which contained the compound (A) and the compound (B) showed a smaller amount of decrease of the film (namely, had a smaller O$_2$ plasma etching rate), as compared to the silicon-containing film obtained using the composition of Comparative Example 2 which contained the compound (A) but did not contain the compound (B).

The above results have revealed that the metal-containing films obtained using the compositions of Examples 1 to 9 have a smaller O$_2$ plasma etching rate, namely have a better etching selectivity, as compared to the organic film (Comparative Example 1) and the silicon-containing film (Comparative Example 2).

A spin-on carbon film (SOC film) and a SiO$_2$ film (P-TEOS film) were each formed on a silicon substrate, according to the following method.

Comparative Example 4

A resist solution was coated on a silicon substrate, followed by drying, to form a spin-on carbon film (SOC film) having a thickness of 55 nm, as an organic film.

Comparative Example 5

Using a mixed gas of tetraethoxysilane (TEOS) and oxygen, a $SiO_2$ film (P-TEOS film) having a thickness of 95 nm was formed on a silicon substrate, by a plasma CVD method.

<Evaluation 2 of Etching Selectivity>

Each of the metal-containing films of Examples 2, 4, 5, 7 and 11, prepared on a silicon substrate according to the above described method, was subjected to a plasma etching treatment, using a parallel plate type plasma processing apparatus, RIE1515Z, manufactured by ULVAC, Inc.

Each of the metal-containing films obtained in the respective Examples was placed in a chamber. After reducing the pressure in the chamber to 1 Pa or less, $Cl_2$ gas as an etching gas was introduced into the chamber at 30 cc/min, to control the pressure in the chamber to 7 Pa.

Subsequently, a high-frequency electric power of 13.56 MHz was applied to generate a plasma discharge, and a plasma treatment was carried out for 30 seconds.

Thereafter, each of $O_2$ gas, $CHF_3$ gas, and $CF_4$ gas was used as an etching gas, instead of $Cl_2$ gas, and a plasma treatment was carried out in the same manner as described above.

The plasma treatment was carried out for 30 seconds in the case of using $O_2$ plasma, 60 seconds in the case of using $CHF_3$ plasma, and 30 seconds in the case of using $CF_4$ plasma.

The results are shown in Table 3.

In Table 3, a negative etching rate indicates that the thickness of the film has instead increased, due to the adhesion of a substance(s) to the film. In other words, a negative etching rate indicates that the film has not been etched.

Further, the evaluation 2 of the etching selectivity was also carried out for the SOC film of Comparative Example 4 and the P-TEOS film of Comparative Example 5, in the same manner as described above. The results are shown in Table 3.

TABLE 3

| | Comparative Example 4: SOC film | Comparative Example 5: P-TEOS film | Example 4: BPEI + BCGe + $NH_3$ | Example 7: pXDA + BCGe + EA | Example 2: 3APDES + BCGe + $NH_3$ | Example 11: pXDA + BCGe + 124BTC + EA | Example 5: BCGe + $NH_3$ |
|---|---|---|---|---|---|---|---|
| Si content (%) | 0.0 | 33.3 | 0.0 | 0.0 | 5.1 | 0.0 | 0.0 |
| Ge content (%) | 0.0 | 0.0 | 10.5 | 8.7 | 5.1 | 10.7 | 15.4 |
| $Cl_2$ plasma etching rate (nm/sec) | 0.48 | 0.03 | 0.62 | 0.70 | — | 0.94 | 0.49 |
| $O_2$ plasma etching rate (nm/sec) | 1.53 | 0.01 | 0.03 | 0.10 | 0.06 | 0.20 | 0.05 |
| $CHF_3$ plasma etching rate (nm/sec) | −0.03 | 0.29 | 0.03 | −0.09 | 0.26 | −0.14 | −0.02 |
| $CF_4$ plasma etching rate (nm/sec) | 1.52 | 0.84 | 0.44 | 2.43 | 4.68 | 2.69 | 3.88 |

As shown in Table 3, it has been found out that the metal-containing films obtained using the compositions of Examples 2, 4, 5, 7 and 11 which contain the compound (A) and the compound (B) have an etching selectivity different from the etching selectivity of the SOC film (Comparative Example 4) and that of the P-TEOS film (Comparative Example 5).

For example, the metal-containing film obtained from the composition of Example 4 was less easily etched by $O_2$ plasma and $CF_4$ plasma, and more easily etched by $Cl_2$ plasma and $CHF_3$ plasma, as compared to the SOC film (Comparative Example 4). Further, the above described metal-containing film (Example 4) was less easily etched by $CHF_3$ plasma and $CF_4$ plasma, and more easily etched by $Cl_2$ plasma and $O_2$ plasma, as compared to the P-TEOS film (Comparative Example 5).

<Evaluation of Heat Resistance>

The evaluation of heat resistance was carried out using each of the compositions obtained in Examples 1 and 5 to 7, and Comparative Example 3, according to the following method.

Using a thermogravimetric apparatus (DTG-60 (model number), manufactured by Shimadzu Corporation), 100 mg of each composition placed in a sample cup was heated from a temperature of 30° C. to 550° C. at a temperature rise rate of 30° C./minute, under a nitrogen atmosphere, and the mass of the composition at each temperature was measured. The temperature at which the mass of each composition was decreased by 10% from the mass thereof at 300° C. was determined, and the results are shown in Table 4.

TABLE 4

| Example 1: 3APDES + BCGe + NH₃ + formic | Example 5: BCGe + NH₃ | Example 6: pXDA + BCGe + NH₃ | Example 7: pXDA + BCGe + EA | Comparative Example 3: 3APDES + formic |
|---|---|---|---|---|
| 396° C. | 358° C. | 404° C. | 398° C. | 349° C. |

As shown in Table 4, the solids obtained from the compositions of Examples 1 and 5 to 7 which contain the compound (A) and the compound (B) have a higher heat resistance, as compared to the solid obtained from the composition of Comparative Example 3 which contains only the compound (A).

The above results suggest that the use of any of the compositions of Examples 1 and 5 to 7 which contain the compound (A) and the compound (B) allows for forming a metal-containing film having an excellent heat resistance.

In particular, the solids obtained from the compositions of Examples 1, 6 and 7 which contain the compound (a1) and the compound (a2) as the compound (A) have a higher heat resistance, as compared to the solid obtained from the composition of Example 5 which contains only the compound (a2) as the compound (A).

<Evaluation of Filling Properties into Trench (Evaluation of Embeddability)>

The evaluation of filling properties was carried out using each of the compositions of Examples 1, 2, 7, 10 and 11, according to the following method.

On a silicon oxide substrate in which a trench pattern having a width of 100 nm and a depth of 200 nm was formed, 0.5 cc of each of the compositions of Examples 1, 2, 7, 10 and 11 was dropped. Thereafter, the silicon oxide substrate was rotated at 1,000 rpm for 5 seconds, and then at 500 rpm for 30 seconds. Subsequently, the dropped composition was dried at 100° C. for one minute, then heated at 250° C. for one minute, and further subjected to a heat treatment at 400° C. for 10 minutes.

Thereafter, the substrate was observed by cross section SEM, to confirm whether the trench had been filled with the composition or not. In a case in which the area which had been filled with the composition was 90% or more of the total area within the trench, the composition was evaluated as A (having favorable filling properties).

Further, the same evaluation as described above was carried out for each of the compositions of Examples 7, 10 and 11, using a silicon oxide substrate in which a trench pattern having a width of 50 nm and a depth of 200 nm was formed.

The results are shown in Table 5. In Table 5, the symbol "-" indicates that the measurement was not carried out.

TABLE 5

| | Example 1: 3APDES + BCGe + NH₃ + formic | Example 2: 3APDES + BCGe + NH₃ | Example 7: pXDA + BCGe + EA | Example 10: pXDA + BCGe + 135BTC + EA | Example 11: pXDA + BCGe + 124BTC + EA |
|---|---|---|---|---|---|
| 100 nm width-trench | A | A | A | A | A |
| 50 nm width-trench | — | — | A | A | A |

As shown in Table 5, each of Examples 1, 2, 7, 10 and 11 had favorable filling properties into a trench (embeddability).

The above results have revealed that, by using any of the compositions of Examples 1, 2, 7, 10 and 11 which contain the compound (A) and the compound (B), for example, in the formation of an embedded dielectric film in a semiconductor device, it is possible to obtain an embedded dielectric film having excellent filling properties into a trench (embeddability).

<Evaluation of Electrical Properties>

The evaluation of electrical properties was carried out using each of the compositions of Examples 1, 4 and 7, according to the following method.

5 mL of each of the compositions of Examples 1, 4 and 7 was dropped on a low resistance silicon substrate. Thereafter, the low resistance silicon substrate was rotated at 1,000 rpm for 5 seconds, and then at 500 rpm for 30 seconds. Subsequently, the dropped composition was dried at 100° C. for one minute, then heated at 250° C. for one minute, and further subjected to a heat treatment at 400° C. for 10 minutes. In this manner, a laminated body composed of the low resistance silicon substrate and a film was obtained.

Using each laminated body obtained as described above, the measurements of relative permittivity and leakage current density of the resulting metal-containing film were carried out, according to the following methods. The results are shown in Table 6.

(Measurement of Relative Permittivity)

The relative permittivity of the film in each resulting laminated body was measured.

Using a mercury probe device (SSM5130), the relative permittivity was measured by an ordinary method at 25° C., under an atmosphere of 30% relative humidity, and at a frequency of 100 kHz.

(Measurement of Leakage Current Density)

The mercury probe was brought into contact with the surface of the film in each resulting laminated body, and the relationship between electric field intensity and leakage current density was measured. The measured value at an electric field intensity of 1 MV/cm was taken as the leakage current density.

TABLE 6

|  | Example 1: 3APDES + BCGe + formic + NH$_3$ | Example 4: BPEI + BCGe + NH$_3$ | Example 7: pXDA + BCGe + EA |
|---|---|---|---|
| Relative permittivity | 4.2 | 5.9 | 5.2 |
| Leakage current density (A/cm$^2$) (electric field intensity 1 MV/cm) | 6.20E−08 | 1.60E−04 | 1.40E−07 |
| Film thickness (nm) | 71.8 | 41.2 | 88.2 |

As shown in Table 6, all of the metal-containing films obtained from the compositions of Examples 1, 4 and 7 had a high relative permittivity, and a low leakage current density.

The above results have revealed that, by using any of the compositions of Examples 1, 4 and 7 which contain the compound (A) and the compound (B), for example, in the formation of an embedded dielectric film in a semiconductor device, it is possible to improve the insulation properties of the resulting embedded dielectric film.

The disclosure of Japanese Patent Application No. 2016-100774, filed May 19, 2016, is herein incorporated by reference in its entirety.

All documents, patent applications, and technical standards described in this specification are incorporated herein by reference to the same extent as if each individual document, patent application, or technical standard was specifically and individually indicated to be incorporated by reference.

The invention claimed is:

1. A composition for forming a metal-containing film, the composition comprising:
   a compound (A) which is at least one selected from the group consisting of:
      a compound (a1) containing a cationic functional group containing at least one of a primary nitrogen atom or a secondary nitrogen atom, and
      a compound (a2) which is a compound other than the compound (a1) and which contains a nitrogen atom; and
   a compound (B) which is at least one selected from the group consisting of:
      a compound (b1) containing a carboxyl group and at least one of a germanium atom, a tin atom, or a selenium atom, and
      an ester of the compound (b1),
   wherein the compound (b1) is a compound represented by the following Formula (1) or the following Formula (2), or a polymer comprising at least one of a structural unit represented by the following Formula (3) or a structural unit represented by the following Formula (4):

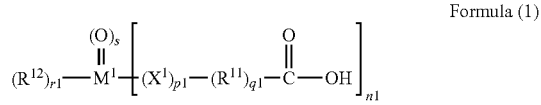

Formula (1)

wherein, in Formula (1), $M^1$ represents a germanium atom, a tin atom, or a selenium atom;

$X^1$ represents —S—, —S—S—, —O—, —NH—, or —NR$^{13}$—, R$^3$ representing an alkyl group having from 1 to 10 carbon atoms;

$R^{11}$ represents an optionally substituted alkylene group having from 1 to 10 carbon atoms;

$R^{12}$ represents a hydrogen atom, an alkyl group having from 1 to 5 carbon atoms, a hydroxy group, an alkoxy group having from 1 to 5 carbon atoms, or a halogen atom;

p1 represents 0 or 1, and q1 represents 0 or 1; and n1 represents an integer of 1 or more, r1 represents an integer of 0 or more, and s represents an integer of 0 or more, a sum of n1+r1+2s being a valence of $M^1$

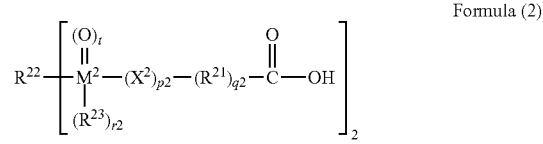

Formula (2)

wherein, in Formula (2), $M^2$ represents a germanium atom, a tin atom, or a selenium atom;

$X^2$ represents —S—, —S—S—, —O—, —NH—, or R$^{24}$ representing an alkyl group having from 1 to 10 carbon atoms;

$R^{21}$ represents an optionally substituted alkylene group having from 1 to 10 carbon atoms;

$R^{22}$ represents a single bond, —O—, or —NR$^{25}$—, R$^{25}$ representing an optionally substituted alkyl group having from 1 to 10 carbon atoms;

$R^{23}$ represents a hydrogen atom, an alkyl group having from 1 to 5 carbon atoms, a hydroxy group, an alkoxy group having from 1 to 5 carbon atoms, or a halogen atom;

p2 represents 0 or 1, and q2 represents 0 or 1; and r2 represents an integer of 0 or more, and t represents an integer of 0 or more

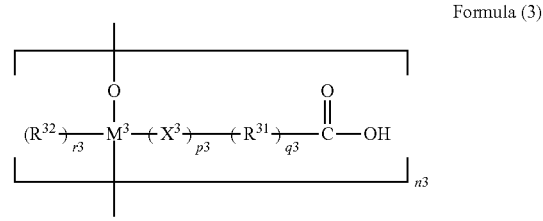

Formula (3)

wherein, in Formula (3), $M^3$ represents a germanium atom or a tin atom;

$X^3$ represents —S—, —S—S—, —O—, —NH—, or —NR$^{33}$—, R$^{33}$ representing an alkyl group having from 1 to 10 carbon atoms;

$R^{31}$ represents an optionally substituted alkylene group having from 1 to 10 carbon atoms;

$R^{32}$ represents a hydrogen atom, an alkyl group having from 1 to 5 carbon atoms, a hydroxy group, an alkoxy group having from 1 to 5 carbon atoms, or a halogen atom;

p3 represents 0 or 1, and q3 represents 0 or 1;
r3 represents 0 or 1; and
n3 represents an integer of 2 or more

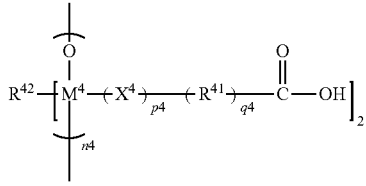
Formula (4)

wherein, in Formula (4), $M^4$ represents a germanium atom or a tin atom;

$X^4$ represents —S—, —S—S—, —O—, —NH—, or —NR$^{43}$—, R$^{43}$ representing an alkyl group having from 1 to 10 carbon atoms;

$R^{41}$ represents an optionally substituted alkylene group having from 1 to 10 carbon atoms;

$R^{42}$ represents a single bond, —O—, or R$^{44}$ representing an optionally substituted alkyl group having from 1 to 10 carbon atoms;

p4 represents 0 or 1, and q4 represents 0 or 1; and
n4 represents an integer of 2 or more.

2. The composition for forming a metal-containing film according to claim 1,
wherein the compound (a1) has a weight average molecular weight of from 130 to 400,000; and
wherein the compound (a2) has a weight average molecular weight of from 17 to 120.

3. The composition for forming a metal-containing film according to claim 1, wherein the compound (A) comprises the compound (a2).

4. The composition for forming a metal-containing film according to claim 1,
wherein the compound (a1) is at least one selected from the group consisting of:
an aliphatic amine (A-1) having a weight average molecular weight of from 10,000 to 200,000,
a compound (A-2) containing a siloxane bond (Si—O bond) and an amino group, and having a weight average molecular weight of from 130 to 50,000, and
an amine (A-3) having a ring structure and having a weight average molecular weight of from 90 to 600; and
wherein the compound (a2) is a base (A-4).

5. The composition for forming a metal-containing film according to claim 1, wherein the compound (B) has a weight average molecular weight of from 120 to 50,000.

6. The composition for forming a metal-containing film according to claim 1,
wherein, in Formula (1), in a case in which $M^1$ represents a germanium atom or a tin atom, the sum of n1+r1+2s is 4, and in a case in which $M^1$ is a selenium atom, the sum of n1+r1+2s is 2; and
wherein, in Formula (2), in a case in which $M^2$ represents a germanium atom or a tin atom, a sum of r2+2t+2 is 4, and in a case in which $M^2$ represents a selenium atom, the sum of r2+2t+2 is 2.

7. The composition for forming a metal-containing film according to claim 1, further comprising an additive (C) which is an acid containing a carboxy group and having a weight average molecular weight of from 46 to 195.

8. The composition for forming a metal-containing film according to claim 1, further comprising a crosslinking agent (D) having a weight average molecular weight of from 200 to 600 and containing three or more —C(═O)OX groups within a molecule, each X representing a hydrogen atom or an alkyl group having from 1 to 6 carbon atoms, and from one to six of the three or more —C(═O)OX groups each being a —C(═O)OH group.

9. The composition for forming a metal-containing film according to claim 1,
wherein, in Formula (1), $M^1$ represents a germanium atom or a tin atom, and q1 represents 1;
wherein, in Formula (2), $M^2$ represents a germanium atom or a tin atom, and q2 represents 1;
wherein, in Formula (3), q3 represents 1; and
wherein, in Formula (4), q4 represents 1.

10. The composition for forming a metal-containing film according to claim 9,
wherein the compound (A) includes at least one selected from the group consisting of:
an aliphatic amine (A-1) having a weight average molecular weight of from 10,000 to 200,000,
a compound (A-2) containing a siloxane bond (Si—O bond) and an amino group, and having a weight average molecular weight of from 130 to 50,000, and
an amine (A-3) having a ring structure and having a weight average molecular weight of from 90 to 600.

11. A method of producing the composition for forming a metal-containing film according to claim 1, the method comprising:
a mixing step of mixing at least the compound (A) and the compound (B).

12. The method of producing the composition for forming a metal-containing film according to claim 11, wherein the mixing step is a step of mixing at least a mixture of the compound (a2) and the compound (B), with the compound (a1).

13. The method of producing the composition for forming a metal-containing film according to claim 11, wherein the mixing step is a step of mixing at least: a mixture of an additive (C) which is an acid containing a carboxy group and having a weight average molecular weight of from 46 to 195, and the compound (a1), with the compound (B).

14. The method of producing the composition for forming a metal-containing film according to claim 11, wherein the mixing step is a step of mixing at least: a mixture of the compound (a2) and the compound (B), with a mixture of an additive (C) which is an acid containing a carboxy group and having a weight average molecular weight of from 46 to 195, and the compound (a1).

15. A method of producing a semiconductor device comprising a metal-containing film which is an embedded dielectric film, the method comprising:
a step of forming the embedded dielectric film utilizing the composition for forming a metal-containing film according to claim 1.

* * * * *